United States Patent
Jung et al.

(10) Patent No.: US 9,728,259 B1
(45) Date of Patent: Aug. 8, 2017

(54) NON-VOLATILE (NV)-CONTENT ADDRESSABLE MEMORY (CAM) (NV-CAM) CELLS EMPLOYING DIFFERENTIAL MAGNETIC TUNNEL JUNCTION (MTJ) SENSING FOR INCREASED SENSE MARGIN

(71) Applicants: Qualcomm Technologies, Inc., San Diego, CA (US); Industry-Academic Cooperation Foundation, Yonsei University, Seoul (KR)

(72) Inventors: Seong-Ook Jung, Seoul (KR); Byung Kyu Song, Seoul (KR); Taehui Na, Seoul (KR); Jung Pill Kim, San Diego, CA (US); Seung Hyuk Kang, San Diego, CA (US)

(73) Assignees: QUALCOMM Technologies, Inc., San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/070,621

(22) Filed: Mar. 15, 2016

(51) Int. Cl.
*G11C 15/02* (2006.01)
*G11C 15/00* (2006.01)
(Continued)

(52) U.S. Cl.
CPC ........ *G11C 15/046* (2013.01); *G11C 11/1673* (2013.01)

(58) Field of Classification Search
None
See application file for complete search history.

(56) References Cited

U.S. PATENT DOCUMENTS

| 8,023,299 B1 * | 9/2011 | Gharia | G11C 11/16 365/49.1 |
| 8,228,703 B2 | 7/2012 | Javerliac et al. | |

(Continued)

OTHER PUBLICATIONS

Chang, Meng-Fan et al., "A 3T1R Nonvolatile TCAM Using MLC ReRAM with Sub-1ns Search Time," 2015 IEEE International Solid-State Circuits Conference (ISSCC 2015), Digest of Technical Papers, Feb. 25, 2015, pp. 318-319.
(Continued)

*Primary Examiner* — Han Yang
*Assistant Examiner* — Sultana Begum
(74) *Attorney, Agent, or Firm* — Withrow & Terranova, PLLC

(57) ABSTRACT

Non-volatile (NV)-content addressable memory (CAM) (NV-CAM) cells employing differential magnetic tunnel junction (MTJ) sensing for increased sense margin are disclosed. By the NV-CAM cells employing MTJ differential sensing, differential cell voltages can be generated for match and mismatch conditions in response to search operations. The differential cell voltages are amplified to provide a larger match line voltage differential for match and mismatch conditions, thus providing a larger sense margin between match and mismatch conditions. For example, a cross-coupled transistor sense amplifier employing positive feedback may be employed to amplify the differential cell voltages to provide a larger match line voltage differential for match and mismatch conditions. Providing NV-CAM cells that have a larger sense margin can mitigate sensing issues for increased search operation reliability. One non-limiting example of an NV-CAM cell that employs MTJ differential sensing is a ten (10) transistor (10T)-four (4) MTJ (10T-4MTJ) NV-TCAM cell.

30 Claims, 17 Drawing Sheets

(51) Int. Cl.
 *G11C 15/04* (2006.01)
 *G11C 11/16* (2006.01)

(56) References Cited

U.S. PATENT DOCUMENTS

| | | | |
|---|---|---|---|
| 8,576,601 B2 | 11/2013 | Marukame et al. | |
| 2008/0084724 A1* | 4/2008 | Nozieres | G11C 11/16 365/50 |
| 2009/0207642 A1* | 8/2009 | Shimano | G11C 8/04 365/72 |
| 2013/0054886 A1 | 2/2013 | Eshraghian et al. | |
| 2015/0206586 A1 | 7/2015 | Chang et al. | |
| 2015/0235703 A1 | 8/2015 | Sakimura et al. | |

OTHER PUBLICATIONS

Huang, Li-Yue et al., "ReRAM-based 4T2R Nonvolatile TCAM with 7x NVM-Stress Reduction, and 4x Improvement in Speed-WordLength-Capacity for Normally-Off Instant-On Filter-Based Search Engines Used in Big-Data Processing," 2014 Symposium on VLSI Circuits Digest of Technical Papers, Jun. 2014, IEEE, 2 pages.
Matsunaga, Shoun et al., "Fully Parallel 6T-2MTJ Nonvolatile TCAM with Single-Transistor-Based Self Match-Line Discharge Control," 2011 Symposium on VLSI Circuits Digest of Technical Papers, 2011, IEEE, pp. 298-299.
Song, Byungkyu et al., "Reference-Circuit Analysis for High-Bandwidth Spin Transfer Torque Random Access Memory," 2015 IEEE/ACM International Symposium on Low Power Electronics and Design (ISLPED), Jul. 2015, IEEE, 6 pages.

* cited by examiner

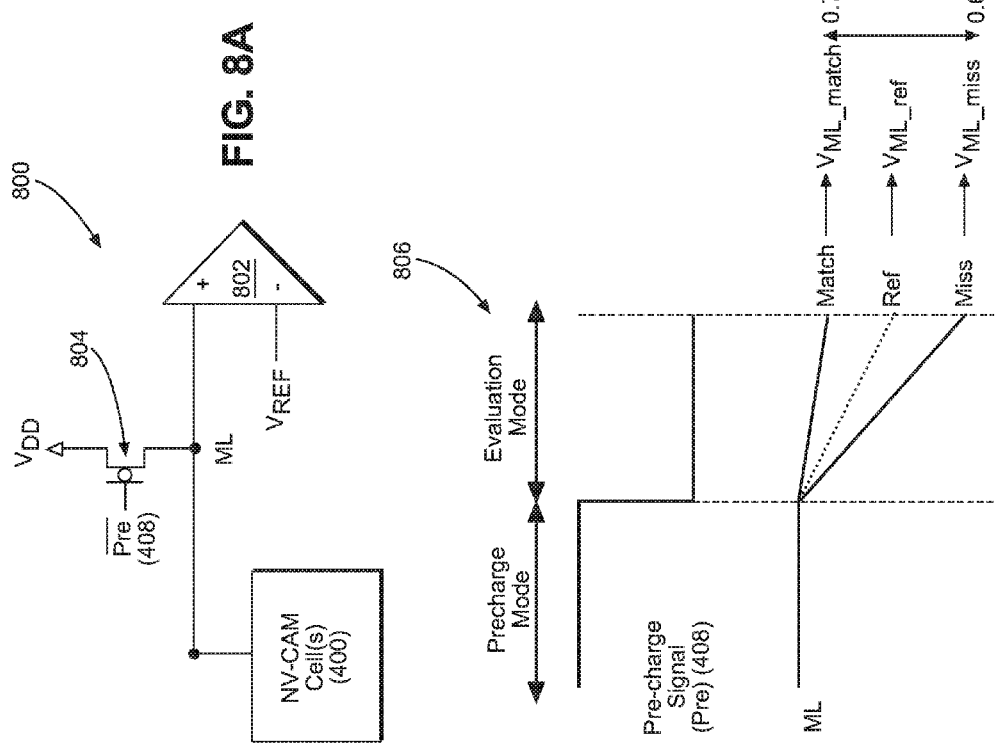

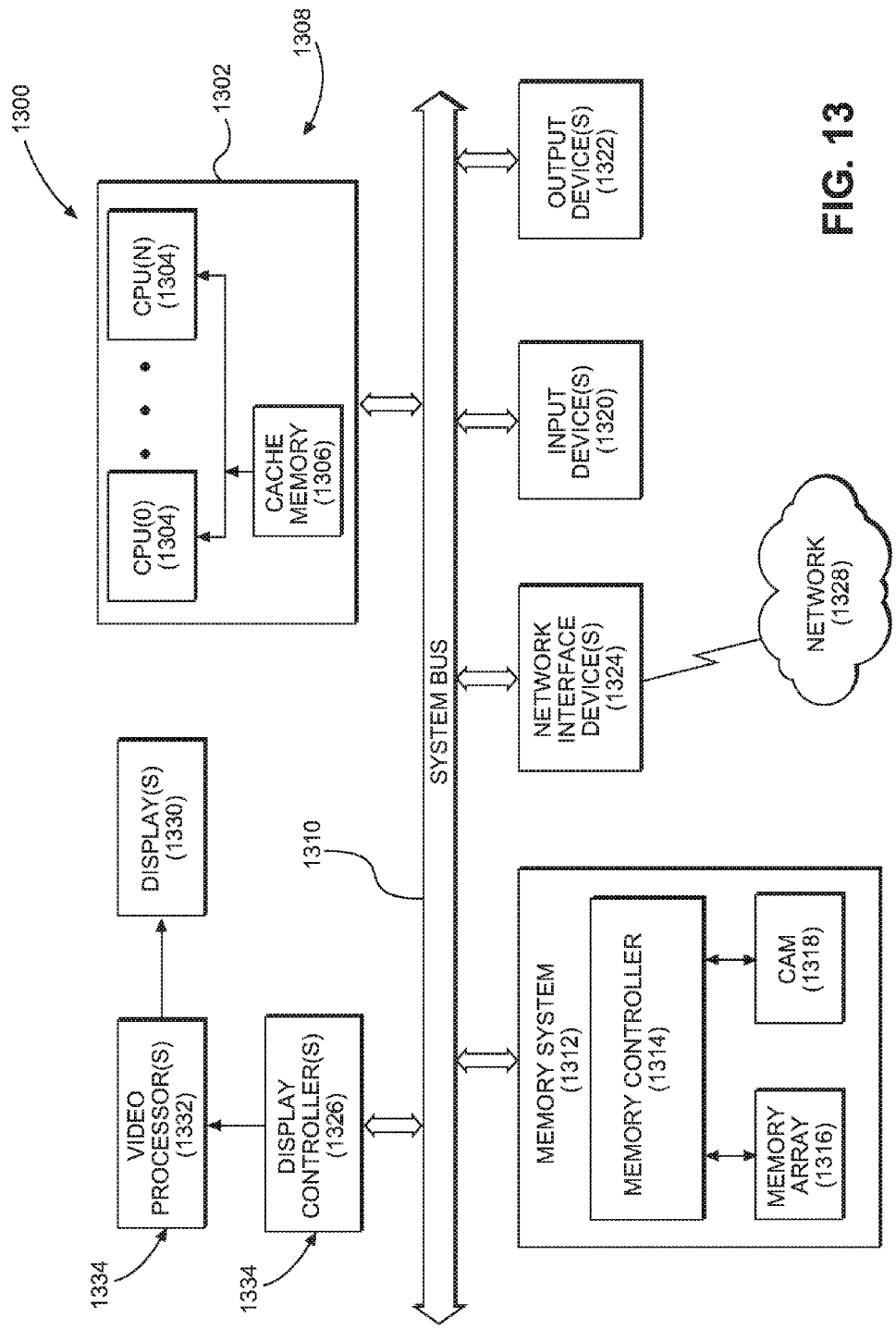

NON-VOLATILE (NV)-CONTENT ADDRESSABLE MEMORY (CAM) (NV-CAM) CELLS EMPLOYING DIFFERENTIAL MAGNETIC TUNNEL JUNCTION (MTJ) SENSING FOR INCREASED SENSE MARGIN

BACKGROUND

I. Field of the Disclosure

The technology of the disclosure relates generally to content addressable memory (CAM), and more particularly to CAM employing non-volatile memory (NVM) cells.

II. Background

Content addressable memory (CAM) is a type of computer memory used in high speed searching applications. Examples of applications that may employ a CAM for high-speed searching include an anti-virus checker in mobile devices and pattern recognition for a wireless sensor. A CAM compares a string of input search data with stored data, and outputs an address of matched data. A CAM enables parallel searching of the input search data in a single clock cycle.

In this regard, FIG. 1 illustrates a conventional CAM 100. The CAM 100 could be a binary CAM capable of storing a data word in two states (i.e., '0' or '1'), or a ternary CAM capable of storing a data word with three states (i.e., '0', '1' and don't care 'X'). The CAM 100 includes CAM cells 102 arranged into a number of CAM cell arrays 104(0)-104(N), wherein 'N+1' equals the desired number of CAM cell arrays 104(0)-104(N) provided. Each of the CAM cells 102 is a conventional semiconductor memory cell and has comparison circuitry. The CAM cell arrays 104(0)-104(N) store corresponding digital words. In addition, the CAM cell arrays 104(0)-104(N) include corresponding valid bit circuitry 106(0)-106(N). For each CAM cell array 104(0)-104(N), the corresponding valid bit circuitry 106(0)-106(N) stores a bit value that represents a validity of the respective CAM cell array 104(0)-104(N). Each CAM cell 102 in a respective CAM cell array 104(0)-104(N) is coupled to a corresponding match line 108(0)-108(N) that is pre-charged as part of a search operation. Then, during an evaluation mode of the search operation, the CAM 100 is searched by a search line driver circuitry 110 asserting search data 112(0)-112(M) of 'M+1' bits onto search lines SL(0)-SL(N). In this example, the CAM cells 102 employ differential sensing such that a complementary search word is also provided on complementary search lines SLB(0)-SLB(N). The CAM cells 102 in their respective CAM cell arrays 104(0)-104(N) are configured to discharge their respective match line 108(0)-108(N) in response to a mismatch between the search data 112(0)-112(M) and the data stored in the respective CAM cell array 104(0)-104(N). A respective match line hold circuit 114(0)-114(N) holds the state of the respective match line 108(0)-108(N) until latched by a latch clock signal (LATCH_CLK) 116.

A static random access memory (SRAM)-based CAM is one example of a CAM. An SRAM-based CAM employs SRAM-based CAM cells for storing data. During a sleep mode, an SRAM-based TCAM employs a non-volatile memory (NVM) macro to retain stored data in TCAM cells. However, this requires long back-up and boot-up processes, leading to increased power consumption and speed overhead. To realize zero standby power with reduced power consumption and speed overhead, a non-volatile (NV)-TCAM cell employing magnetic tunnel junction (MTJ) storage elements has been proposed. For example, FIG. 2A is a circuit diagram of an exemplary six (6) transistor (T) (6T)-two (2) MTJ (2MTJ) non-volatile (NV)-ternary CAM (TCAM) (6T-2MTJ NV-TCAM) cell 200 (referred to as "TCAM cell 200"). The TCAM cell 200 includes a comparator circuit 202 that includes a pair of MTJ devices 204(1), 204(2). The comparator circuit 202 includes a load transistor ($M_{CS}$) having a gate coupled to a bias voltage $V_B$ that provides a constant current source to generate a bias current ($I_B$), and two clamp transistors ($M_{C1}$, $M_{C2}$) coupled between a drain of the load transistor ($M_{CS}$) and the respective MTJ devices 204(1), 204(2). The MTJ devices 204(1), 204(2) being in a parallel (P) state results in the MTJ devices 204(1), 204(2) having a lower resistance than when the MTJ devices 204(1), 204(2) are in an anti-parallel (AP) state. The comparator circuit 202 is coupled to a keeper circuit provided as keeper transistor ($M_D$) coupled to a match line (ML).

During a search operation, the match line (ML) is first pre-charged to a match line voltage ($V_{ML}$) during a pre-charge mode (e.g., $V_{DD}$). Thereafter, during an evaluation mode, search data and complementary search data is asserted onto search line (SL) and complementary search line (/SL), respectively. This causes a cell current ($I_{CELL}$) to flow from the load transistor ($M_{CS}$) to flow through one of (i.e., the activated) clamp transistor ($M_{C1}$, $M_{C2}$) and its respective MTJ device 204(1), 204(2). The cell current ($I_{CELL}$) is a function of the resistance ($R_1$, $R_2$) of the activated MTJ devices 204(1), 204(2), which is based on the stored data (i.e., P or AP state) in the MTJ devices 204(1), 204(2). A cell voltage ($V_{CELL}$) at the drain of the load transistor ($M_{CS}$) is controlled by the difference between the bias current ($I_B$) and the cell current ($I_{CELL}$). As shown in a graph 206 in FIG. 2B, a higher cell voltage ($V_{CELL-H}$) occurs in the TCAM cell 200 for a match condition between the stored data in the TCAM cell 200 and the search data. A lower cell voltage ($V_{CELL-L}$) occurs in the TCAM cell 200 for a mismatch condition between the stored data in the TCAM cell 200 and the search data. Thus, the match line voltage ($V_{ML}$) for a match condition (i.e., match and mismatch) between the stored data in the TCAM cell 200 and the search data on the match line (ML) is a function of a threshold voltage across the keeper transistor ($M_D$) and the cell voltage ($V_{CELL}$). Because the load transistor ($M_{CS}$) and the activated clamp transistor ($M_{C1}$, $M_{C2}$) pre-amplify the cell voltage ($V_{CELL}$) difference between match and mismatch conditions, the match line (ML) can be sensed to determine whether the search data matched or mismatched the stored data in the TCAM cell 200.

For example, as shown in FIG. 3A, a match condition in a TCAM cell array 300 of the TCAM cell 200 in FIG. 2A coupled to a joint match line (ML) causes the match line voltage ($V_{ML}$) to discharge from the pre-charge voltage ($V_{DD}$) to the higher cell voltage ($V_{CELL-H}$)+the threshold voltage ($V_{TH}$) of the keeper transistor ($M_D$). Thus, the keeper transistor ($M_D$) is turned off. However, as shown in FIG. 3B, in the case of a mismatch condition, the keeper transistor ($M_D$) of the TCAM cell 200 in a mismatch condition is not cut off since its cell voltage ($V_{CELL}$) is the lower cell voltage ($V_{CELL-L}$). Thus, the match line (ML) is continuously discharged by the TCAM cell(s) 200 in a mismatch condition to a match line voltage ($V_{ML}$) of the lower cell voltage ($V_{CELL-L}$)+the threshold voltage ($V_{TH}$). The difference in the match line voltage ($V_{ML}$) between the match and mismatch conditions (i.e., $V_{CELL-H}$-$V_{CELL-L}$) is the sense margin of the TCAM cells 200 in the TCAM cell array 300.

Thus, while the TCAM cell 200 in FIG. 2A has the advantage of realizing zero standby power with reduced power consumption and speed overhead, the sense margin is smaller (e.g., 0.1V) than an SRAM-based TCAM cell. Thus, the TCAM cell 200 in FIG. 2A is vulnerable to the offset voltage of a match line (ML) sense amplifier. Additionally, the sense margin of the TCAM cell 200 is also sensitive to process variations in the load transistor ($M_{CS}$) and the clamp transistors ($M_{C1}$, $M_{C2}$). The size of the load transistor ($M_{CS}$) and the clamp transistors ($M_{C1}$, $M_{C2}$) can be increased to mitigate process variations, but increasing the size of the load transistor ($M_{CS}$) and the clamp transistors ($M_{C1}$, $M_{C2}$) increases the cell area of the TCAM cell 200. Further, even though the keeper transistor ($M_D$) of the TCAM cell 200 is turned off during a match condition, reverse leakage current can flow into the match line (ML) because of the higher drain-to-source voltage of the keeper transistor ($M_D$). As word length, and thus the word line (WL), of a TCAM employing the TCAM cells 200 increases, this reverse current leakage can leak from the TCAM cell 200 in a match condition to the TCAM cell 200 in a mismatch condition, thus leading to degradation of search operation reliability. Further, if a global bias voltage generator circuit is employed in a TCAM of the TCAM cell 200, global bias voltage ($V_B$) is used to bias load transistors ($M_{CS}$) in the TCAM cell 200 in a TCAM, a coupling noise effect can lead to degradation of search performance.

SUMMARY OF THE DISCLOSURE

Aspects of the present disclosure include non-volatile (NV)-content addressable memory (CAM) (NV-CAM) cells employing differential magnetic tunnel junction (MTJ) sensing for increased sense margin. The NV-CAM cells can be employed in a CAM, including a binary CAM and a ternary CAM as non-limiting examples. Employing MTJs as part of the NV-CAM cells in a CAM allows the CAM to have zero or near zero standby power with reduced power consumption and speed overhead, as opposed to SRAM-based NV-CAM cells for example. Further, by the NV-CAM cells disclosed herein employing MTJ differential sensing, differential cell voltages can be generated for match and mismatch conditions in response to search operations. The differential cell voltages are amplified to provide a larger match line voltage differential for match and mismatch conditions, thus providing a larger sense margin between match and mismatch conditions. Providing NV-CAM cells that have a larger sense margin can mitigate sensing issues for increased search operation reliability. For example, providing a larger sense margin in NV-CAM cells can make search operations less susceptible to an offset voltage of a match line sense amplifier. As another example, providing NV-CAM cells that have a larger sense margin can make search operations less sensitive to process variations in transistor and/or MTJ devices in the NV-CAM cells that can vary the differential cell voltages generated for match and mismatch conditions, without, for example, increasing transistor sizes, and thus increasing NV-CAM cell area. Further as another example, providing NV-CAM cells that have a larger sense margin can make search operations less susceptible to coupling noise effects that may result from employing a global bias voltage to the NV-CAM cells.

In certain aspects disclosed herein, the NV-CAM cells employ a differential MTJ cell circuit for storing data (e.g., a bit). The differential MTJ cell circuit includes a first MTJ circuit coupled to a data node and a second MTJ circuit coupled to a reference node. The first and second MTJ circuits are configured to provide differential cell voltages on the data node and reference node during search operations in response to search data being asserted on a search line and complementary search line for a search operation. In response to the search data and the complementary search data being asserted on the search line and the complementary search line, respectively, for the search operation, a differential resistance will exist between the first and second MTJ circuits based on whether a match or mismatch condition exists. For example, the first MTJ circuit may be configured such that its resistance is higher than the resistance of the second MTJ circuit for a match condition (and vice versa for a mismatch condition). In response to the differential resistances of the first and second MTJ circuits, differential cell voltages are present at the data and references cell nodes, respectively. The differential cell voltages are amplified by a cross-coupled transistor sense amplifier coupled to the data and reference nodes. The positive feedback of the cross-coupled sense amplifier increases the differential cell voltage between the data and reference cells nodes, thus providing a larger match line voltage differential and sense margin for match and mismatch conditions.

One non-limiting example of a NV-CAM cell that employs MTJ differential sensing is a ten (10) transistor (10T)-four (4) MTJ (10T-4MTJ) NV-ternary (T) CAM cell.

In this regard, in one aspect, a NV-CAM cell is provided. The NV-CAM cell comprises a differential MTJ cell circuit. The differential MTJ cell circuit comprises a first MTJ circuit configured to receive search data on a search line and complementary search data, complementary to the search data, on a complementary search line. The differential MTJ cell circuit also comprises a second MTJ circuit configured to receive the search data on the search line and the complementary search data on the complementary search line. The differential MTJ cell circuit is configured to generate a differential cell voltage comprising a data cell voltage on a data node and a reference cell voltage on a reference node, in response to a first differential resistance level between the first MTJ circuit and the second MTJ circuit indicating a match condition of the search data, in response to the search data being in an activation state on the search line, and in response to a second differential resistance level between the first MTJ circuit and the second MTJ circuit indicating the match condition of the search data, in response to the complementary search data being in the activation state on the complementary search line. The NV-CAM cell also comprises a cross-coupled metal oxide semiconductor (MOS) amplifier circuit. The cross-coupled MOS amplifier circuit comprises a first transistor configured to be activated in response to the data cell voltage on the data node indicating a mismatch condition with the search data, to couple a supply voltage rail to the reference node. The cross-coupled MOS amplifier circuit also comprises a second transistor configured to be activated in response to the reference cell voltage on the reference node indicating the match condition with the search data, to couple the supply voltage rail to the data node.

In another aspect, a NV-CAM cell is provided. The NV-CAM cell comprises a means for generating a first resistance based on a first MTJ resistance, in response to receiving search data on a search line and complementary search data, complementary to the search data, on a complementary search line. The NV-CAM cell also comprises a means for generating a second resistance based on a second MTJ resistance, in response to receiving the search data on the search line and the complementary search data on the complementary search line. The NV-CAM cell also comprises a means for generating a differential cell voltage comprising a data cell voltage on a data node and a reference cell voltage on a reference node, in response to a first differential resistance level between the means for generating the first resistance and the means for generating the second resistance indicating a match condition of the search data, in response to the search data being in an activation state on the search line, and in response to a second differential resistance level between the means for generating the first resistance and the means for generating the second resistance indicating the match condition of the search data, in response to the complementary search data being in the activation state on the complementary search line. The NV-CAM cell also comprises a means for amplifying the differential cell voltage, the means for amplifying comprising a first amplifying means for amplifying the reference cell voltage on the reference node in response to the data cell voltage on the data node indicating a mismatch condition with the search data, and a second amplifying means for amplifying the data cell voltage on the data node in response to the reference cell voltage on the reference node indicating the match condition with the search data.

In another aspect, a method of comparing search data to stored data in a NV-CAM cell is provided. The method comprises receiving search data on a search line in response to a search operation. The method also comprises receiving complementary search data, complementary to the search data, on a complementary search line in response to the search operation. The method also comprises, in response to the search data being in an activation state on the search line, generating a first differential resistance level between a first MTJ circuit and a second MTJ circuit indicating a match condition of the search data, and generating a differential cell voltage comprising a data cell voltage on a data node and a reference cell voltage on a reference node, in response to generating the first differential resistance level. The method also comprises, in response to the complementary search data being in the activation state on the complementary search line, generating a second differential resistance level between the first MTJ circuit and the second MTJ circuit indicating the match condition of the search data, and generating the differential cell voltage comprising the data cell voltage on the data node and the reference cell voltage on the reference node, in response to generating the second differential resistance level. The method also comprises, in response to the reference cell voltage on the reference node indicating the match condition with the search data, coupling a supply voltage rail to the data node. The method also comprises in response to the data cell voltage on the data node indicating a mismatch condition with the search data, coupling the supply voltage rail to the reference node.

In another aspect, a NV-CAM is provided. The NV-CAM comprises a plurality of NV-CAM cell arrays each comprising a plurality of NV-CAM cells. The NV-CAM also comprises a plurality of match lines each coupled to a respective NV-CAM cell array among the plurality of NV-CAM cell arrays. The NV-CAM also comprises at least one pre-charge circuit configured to couple at least one supply voltage rail to the plurality of match lines in response to a pre-charge signal indicating a pre-charge mode in a search operation, to charge the plurality of match lines to a supply voltage coupled to the supply voltage rail. Each NV-CAM cell among the plurality of NV-CAM cells comprises a differential MTJ cell circuit. The differential MTJ cell circuit comprises a first MTJ circuit configured to receive search data on a search line and complementary search data, complementary to the search data, on a complementary search line in response to an evaluation phase of the search operation. The differential MTJ cell circuit also comprises a second MTJ circuit configured to receive the search data on the search line and the complementary search data on the complementary search line in response to the evaluation phase of the search operation. The differential MTJ cell circuit is configured to generate a differential cell voltage comprising a data cell voltage on a data node and a reference cell voltage on a reference node, in response to a first differential resistance level between the first MTJ circuit and the second MTJ circuit indicating a match condition of the search data, in response to the search data being in an activation state on the search line, and in response to a second differential resistance level between the first MTJ circuit and the second MTJ circuit indicating the match condition of the search data, in response to the complementary search data being in the activation state on the complementary search line. Each NV-CAM cell also comprises a cross-coupled MOS amplifier circuit. The cross-coupled MOS amplifier circuit comprises a first transistor configured to be activated in response to the data cell voltage on the data node indicating a mismatch condition with the search data, to couple the at least one supply voltage rail to the reference node. The cross-coupled MOS amplifier circuit also comprises a second transistor configured to be activated in response to the reference cell voltage on the reference node indicating the match condition with the search data, to couple the at least one supply voltage rail to the data node.

BRIEF DESCRIPTION OF THE FIGURES

FIG. 8A is a circuit diagram of a CAM that includes NV-CAM cells employing MTJ differential sensing, such as the NV-CAM cells in FIG. 4, and a sense amplifier;

FIG. 8B is a timing diagram illustrating pre-charge and evaluation modes of a search operation of the NV-CAM cells in the CAM in FIG. 8A, and further illustrating a voltage margin on a match line (ML) between match and mismatch conditions;

FIG. 13 is a block diagram of an exemplary processor-based system that can include a CAM that employs NV-TCAM cells employing MTJ differential sensing to provide differential cell voltages for match and mismatch conditions, wherein the differential cell voltages are further amplified to provide an increased differential cell voltage margin and thus a larger sense margin, including but not limited to the 10T-4MTJ NV-TCAM in FIG. 4.

DETAILED DESCRIPTION

Figure 1:
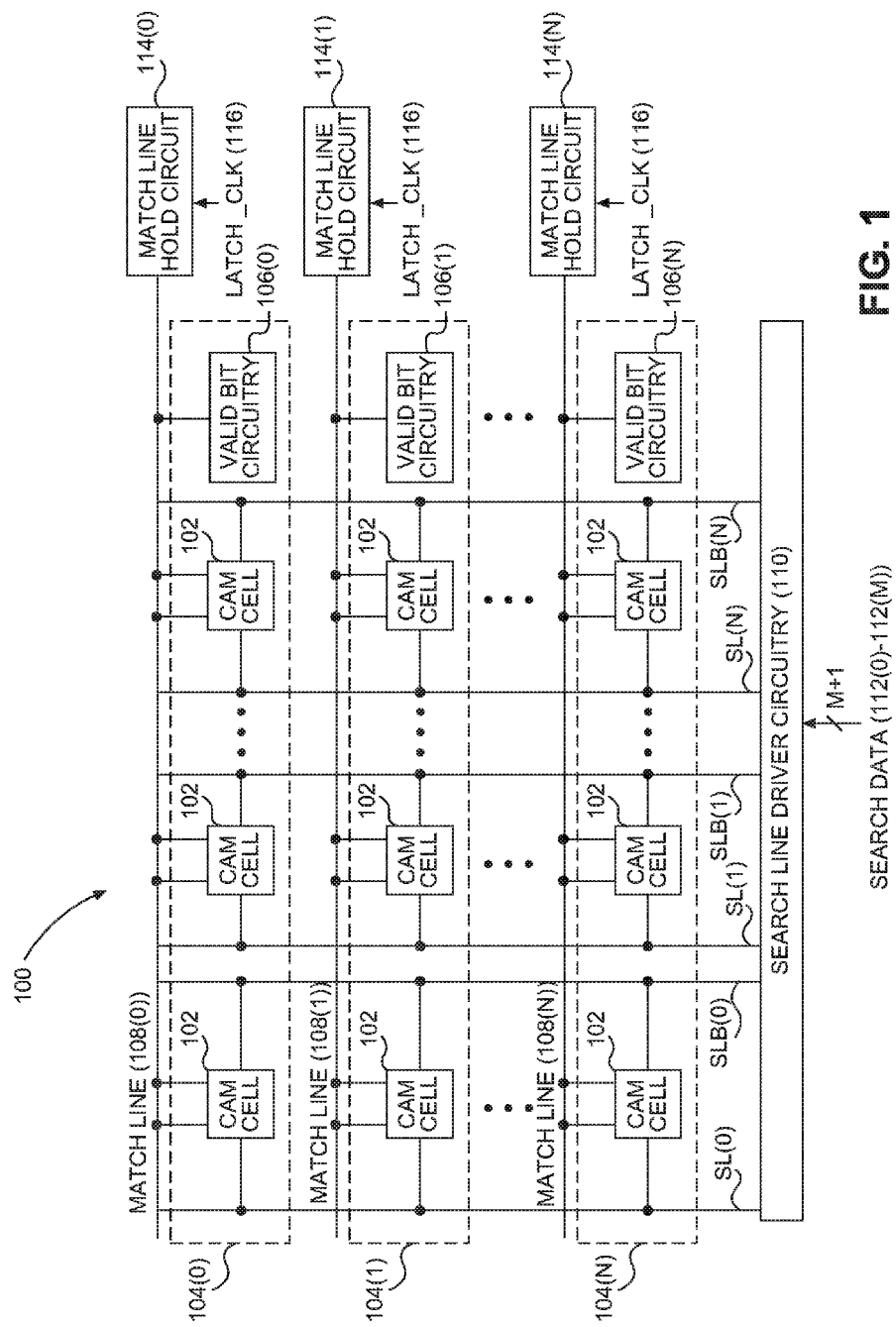
FIG. 1 is a block diagram of an exemplary content addressable memory (CAM)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 4:
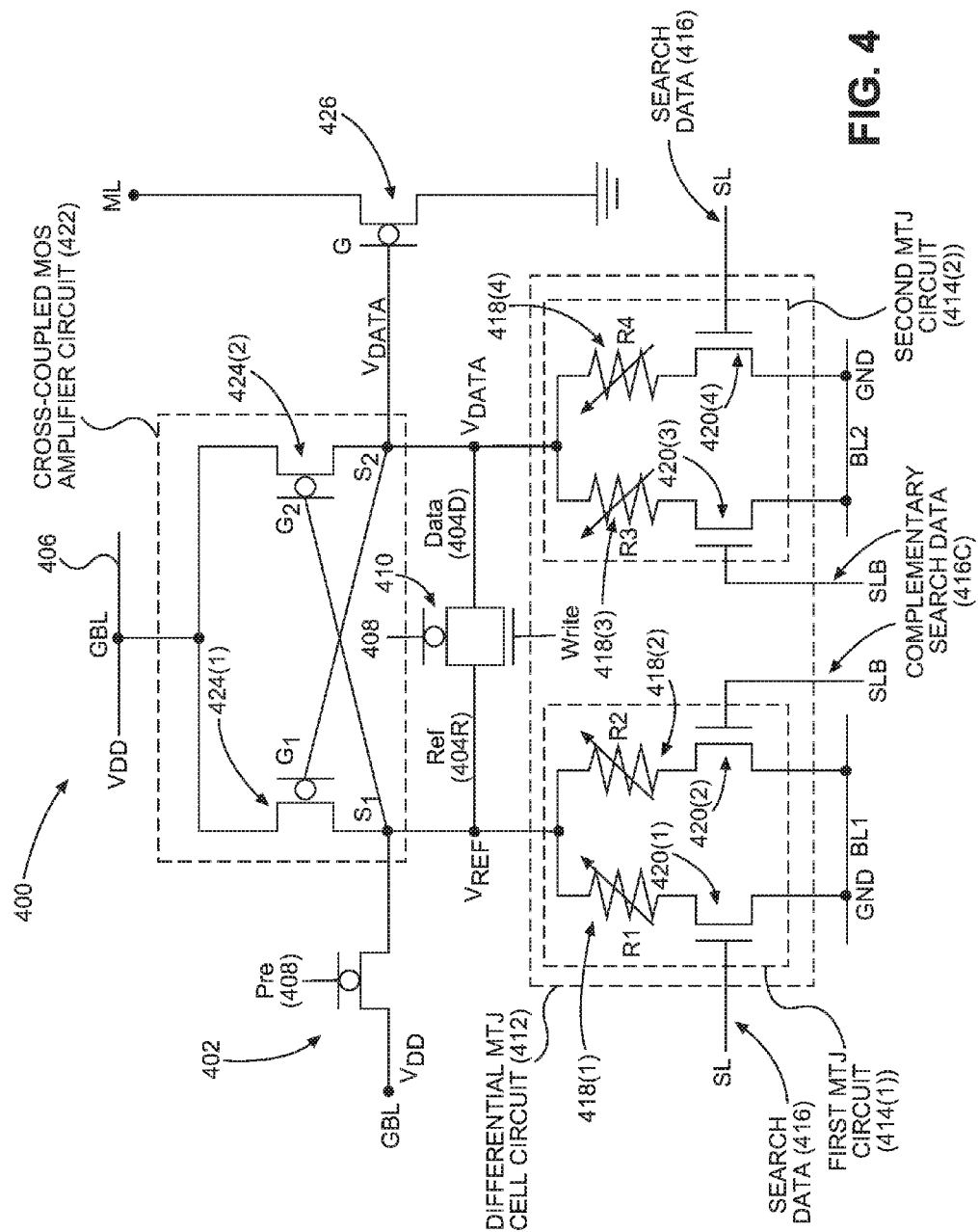
FIG. 4 is a circuit diagram of an exemplary NV-CAM cell provided in the non-limiting form of a ten (10) transistor (10T)-four (4) MTJ (10T-4MTJ) NV-TCAM cell, that employs MTJ differential sensing to provide differential cell voltages for match and mismatch conditions, wherein the differential cell voltages are further amplified to provide an increased differential cell voltage margin, and thus a larger sense margin.

FIG. 4 is a circuit diagram of an exemplary non-volatile (NV)-content addressable memory (CAM) (NV-CAM) cell 400 that employs magnetic tunnel junction (MTJ) differential sensing to provide differential cell voltages for match and mismatch conditions in response to a search operation. In this non-limiting example, the NV-CAM cell 400 is provided in the form of a ten (10) transistor (T), four (4) MTJ (10T-4MTJ) NV-CAM cell. Employing MTJs as part of the NV-CAM cell in a CAM allows the CAM to have zero or near zero standby power with reduced power consumption and speed overhead, as opposed to SRAM-based NV-CAM cells for example. The NV-CAM cell 400 can be employed in a CAM, including a binary CAM and a ternary CAM as non-limiting examples. As will also be discussed in more detail below, the NV-CAM cell 400 is also configured to further amplify the differential cell voltages to provide an increased differential cell voltage margin, and thus a larger sense margin. Thus, the NV-CAM cell 400 having a larger sense margin can mitigate sensing issues for increased search operation reliability.

Figure 5:
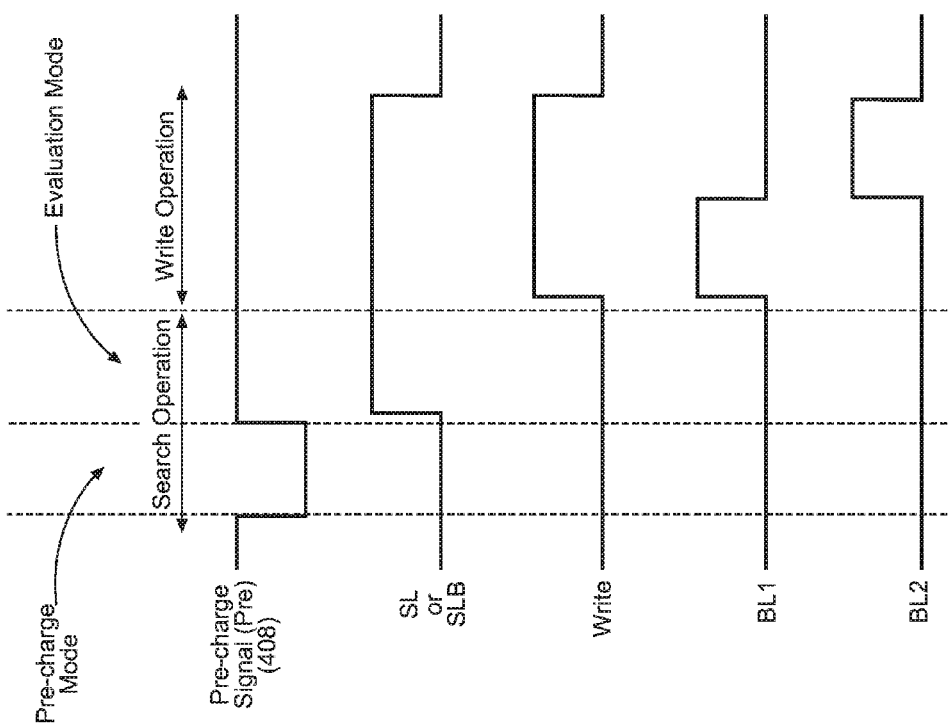
FIG. 5 is a timing diagram for search and write operations for the NV-CAM cell in FIG. 4.

In this regard, the NV-CAM cell 400 in FIG. 4 is capable of performing a search operation in two modes. The first mode is a pre-charge mode. The second mode is an evaluation mode. The NV-CAM cell 400 includes a pre-charge circuit 402 that is configured to couple a global bit line GBL to a reference node (Ref) 404R in response to a pre-charge mode of a search operation. For example, the global bit line GBL may be coupled to a supply voltage rail that receives a supply voltage ($V_{DD}$) from a power supply. The pre-charge circuit 402 is provided in the form of a P-type MOS (PMOS) transistor in this example. The pre-charge circuit 402 is configured to couple the global bit line GBL to the reference node (Ref) 404R in response a pre-charge signal (Pre) 408 indicating a pre-charge mode. This is also shown in a timing diagram in FIG. 5, wherein the pre-charge signal (Pre) 408 is a low signal level during a pre-charge mode of a search operation.

The NV-CAM cell 400 also includes an equalizer circuit 410, provided in the form of a PMOS and N-type MOS (NMOS) transistor pass gate in this example, that is configured to couple the reference node (Ref) 404R to a data node (Data) 404D in response to the pre-charge signal (Pre) 408 indicating a pre-charge mode. Thus, during the pre-charge mode, the reference node (Ref) 404R and the data node (Data) 404D are pre-charge to the voltage on the global bit line GBL. The global bit line GBL may be provided to other NV-CAM cells so that a plurality of NV-CAM cells, including the NV-CAM cell 400 in FIG. 4, can be pre-charged in response to the same pre-charge signal (Pre) 408. During the evaluation mode of a search operation, the pre-charge signal (Pre) 408 is placed in an evaluation mode as shown in the timing diagram in FIG. 5, to cause the pre-charge circuit 402 to decouple the reference node (Ref) 404R from the global bit line GBL, and the equalizer circuit 410 to decouple the reference node (Ref) 404R from the data node (Data) 404D.

With continuing reference to FIG. 4, the NV-CAM cell 400 also includes a differential MTJ cell circuit 412. The differential MTJ cell circuit 412 is configured to provide differential cell voltages of a reference cell voltage Vref and a data cell voltage Vdata on the reference node (Ref) 404R and data node (Data) 404D during a search operation to indicate a match or mismatch condition. As will be discussed in more detail below, the differential MTJ cell circuit 412 is configured to force a differential voltage between the reference cell voltage Vref and the data cell voltage Vdata to indicate the match or mismatch condition of the NV-CAM cell 400 during the evaluation mode of a search operation. As will also be further discussed in more detail below, to provide a larger differential cell voltage between the reference cell voltage Vref and the data cell voltage Vdata on the reference node (Ref) 404R and data node (Data) 404D, respectively during an evaluation mode of a search operation to allow for larger sense margins for increased search reliability and performance in the NV-CAM cell 400, the reference cell voltage Vref and the data cell voltage Vdata are amplified. Before discussing the amplification of the reference cell voltage Vref and the data cell voltage Vdata, exemplary aspects of the differential MTJ cell circuit 412 are first discussed below.

In this regard, the differential MTJ cell circuit 412 includes first and second MTJ circuits 414(1), 414(2) that each includes MTJ devices to provide for differential NV storage and search operations. Employing MTJ devices for data storage allows realization of zero standby power with reduced power consumption and speed overhead data. The first MTJ circuit 414(1) is configured to receive search data 416 on a search line SL and complementary search data 416C, complementary to the search data 416, on a complementary search line SLB. This is also shown in the timing diagram in FIG. 5. For example, if the search data 416 is a logical '0' value, the complementary search data 416C would be a logical '1' value, and vice versa. The first MTJ circuit 414(1) includes a first MTJ device 418(1) that is configured to be in either a parallel (P) or anti-parallel (AP) state for storing data. The first MTJ circuit 414(1) also includes a second MTJ device 418(2) that is configured to be in either a parallel (P) or anti-parallel (AP) state for storing data. The first MTJ device 418(1) is controlled in response to a write operation, as shown in the timing diagram in FIG. 5, to be in an opposite state from the second MTJ device 418(2) to provide a differential storage of data in the first MTJ circuit 414(1).

The first MTJ circuit 414(1) also includes first and second access circuits 420(1), 420(2) provided in the form of NMOS transistors in this example. The first access circuit 420(1) is configured to selectively control coupling of the first MTJ device 418(1) between the reference node (Ref) 404R and a first bit line BL1 in response to the search data 416 being in an activation state on the search line SL. Similarly, the first access circuit 420(1) is configured to selectively control decoupling of the first MTJ device 418(1) between the reference node (Ref) 404R and the first bit line BL1 in response to the search data 416 being in a deactivation state on the search line SL. The second access circuit 420(2) is configured to selectively control coupling of the second MTJ device 418(2) between the reference node (Ref) 404R and the first bit line BL1 in response to the complementary search data 416C being in an activation state on the complementary search line SLB. Similarly, the second access circuit 420(2) is configured to selectively control decoupling of the second MTJ device 418(2) between the reference node (Ref) 404R and the first bit line BL1 in response to the complementary search data 416C being in a deactivation state on the complementary search line SLB. The activation state for the search data 416 and the complementary search data 416C in this example is a logical '1' state, because the first and second access circuits 420(1), 420(2) in this example are NMOS transistors. However, the first and second access circuits 420(1), 420(2) in this example could be provided as PMOS transistors such that the activation state for the search data 416 would be a logical '0' state.

Similarly, the differential MTJ cell circuit 412 also includes a second MTJ circuit 414(2). The second MTJ circuit 414(2) is configured to receive the search data 416 on the search line SL and the complementary search data 416C on the complementary search line SLB. The second MTJ circuit 414(2) includes a third MTJ device 418(3) that is configured to be in either a P or AP state. The second MTJ circuit 414(2) also includes a fourth MTJ device 418(4) that is also configured to be in either a P or AP state. The third MTJ device 418(3) is controlled in response to a write operation to be in an opposite state from the fourth MTJ device 418(4) to provide differential storage of data in the second MTJ circuit 414(2).

The second MTJ circuit 414(2) also includes third and fourth access circuits 420(3), 420(4) provided in the form of NMOS transistors in this example. The third access circuit 420(3) is configured to selectively control coupling of the third MTJ device 418(3) between the data node (Data) 404D and a second bit line BL2 in response to the complementary search data 416C being in an activation state on the complementary search line SLB. Similarly the third access circuit 420(3) is also configured to selectively control decoupling of the third MTJ device 418(3) between the data node (Data) 404D and the second bit line BL2 in response to the complementary search data 416C being in a deactivation state on the complementary search line SLB. The fourth access circuit 420(4) is configured to selectively control coupling of the fourth MTJ device 418(4) between the data node (Data) 404D and the second bit line BL2 in response to the search data 416 being in an activation state on the search line SL. Similarly, the fourth access circuit 420(4) is also configured to selectively control decoupling of the fourth MTJ device 418(4) between the data node (Data) 404D and the second bit line BL2 in response to the search data 416 being in a deactivation state on the search line SL. Note that the third and fourth access circuits 420(3), 420(4) in this example could be provided as PMOS transistors such that the activation state for the search data 416 would be a logical '0' state.

Thus, in the differential MTJ cell circuit 412 in the NV-CAM cell 400 in FIG. 4, in response to a search operation, only either the first MTJ device 418(1) or the second MTJ device 418(2) in the first MTJ circuit 414(1) is coupled between the reference node (Ref) 404R and the first bit line BL1. Thus, in response to a search operation, either the first resistance R1 of the first MTJ device 418(1) or the second resistance R2 of the second MTJ device 418(2) is coupled to the reference node (Ref) 404R. Because the storage states of the first and second MTJ devices 418(1), 418(2) are written as opposite states, the first and second resistances R1 and R2 will vary from each other. If the first MTJ device 418(1) is in a P state and the second MTJ device 418(2) is necessarily in an AP state, the first resistance R1 will be lower than the second resistance R2. However, if the first MTJ device 418(1) is in an AP state and the second MTJ device 418(2) is necessarily in a P state, the first resistance R1 will be higher than the second resistance R2. The reference cell voltage Vref on the reference node (Ref) 404R will be controlled based on the difference in the first or second resistance R1 or R2 coupled to the reference node (Ref) 404R indicative of the storage state of the first MTJ circuit 414(1).

Further, similar to the first MTJ circuit 414(1) in the NV-CAM cell 400 in FIG. 4, in response to a search operation, only either the third MTJ device 418(3) or the fourth MTJ device 418(4) in the second MTJ circuit 414(2) is coupled between the data node (Data) 404D and the second bit line BL2. Thus, in response to a search operation, either the third resistance R3 of the third MTJ device 418(3) or the fourth resistance R4 of the fourth MTJ device 418(4) is coupled to the data node (Data) 404D. Because the storage states of the third and fourth MTJ devices 418(3), 418(4) are written as opposite states, the third and fourth resistances R3 and R4 will vary from each other. If the third MTJ device 418(3) is in a P state and the fourth MTJ device 418(4) is necessarily in an AP state, the third resistance R3 will be lower than fourth resistance R4. However, if the third MTJ device 418(3) is in an AP state and the fourth MTJ device 418(4) is necessarily in a P state, the third resistance R3 will be higher than the fourth resistance R4. The data cell voltage Vdata on the data node (Data) 404D will be controlled based on the third or fourth resistance R3 or R4 coupled to the data node (Data) 404D indicative of the storage state of the second MTJ circuit 414(2).

With continuing reference to FIG. 4, the first MTJ circuit 414(1) and the second MTJ circuit 414(2) are configured such that the first and fourth MTJ devices 418(1), 418(4) are written in response to a write operation as opposite states (i.e., P or AP). Further, the second and third MTJ devices 418(2), 418(3) are written in response to a write operation as opposite states (i.e., P or AP). Thus, when the search data 416 is in an activation state that couples the first and fourth MTJ devices 418(1), 418(4) to the reference node (Ref)

404R and the data node (Data) 404D respectively, the first and fourth resistances R1 and R4 coupled to the reference node (Ref) 404R and the data node (Data) 404D will provide a first differential resistance level (i.e., R1-R4) indicative of a match condition of the search data 416. In response, the reference node (Ref) 404R and the data node (Data) 404D become differential cell voltages in the form of the reference cell voltage Vref and the data cell voltage Vdata that differ from each other based on the difference in respective first and fourth resistances R1 and R4 coupled to the respective reference node (Ref) 404R and the data node (Data) 404D. A cell voltage will be higher at a respective reference node (Ref) 404R and the data node (Data) 404D for a given higher coupled resistance. The difference in resistance between first and fourth resistances R1 and R4 controls the difference between current flowing through the first and fourth MTJ devices 418(1), 418(4), and thus the reference cell voltage Vref and the data cell voltage Vdata when the search data 416 is in an activation state.

Figure 6:
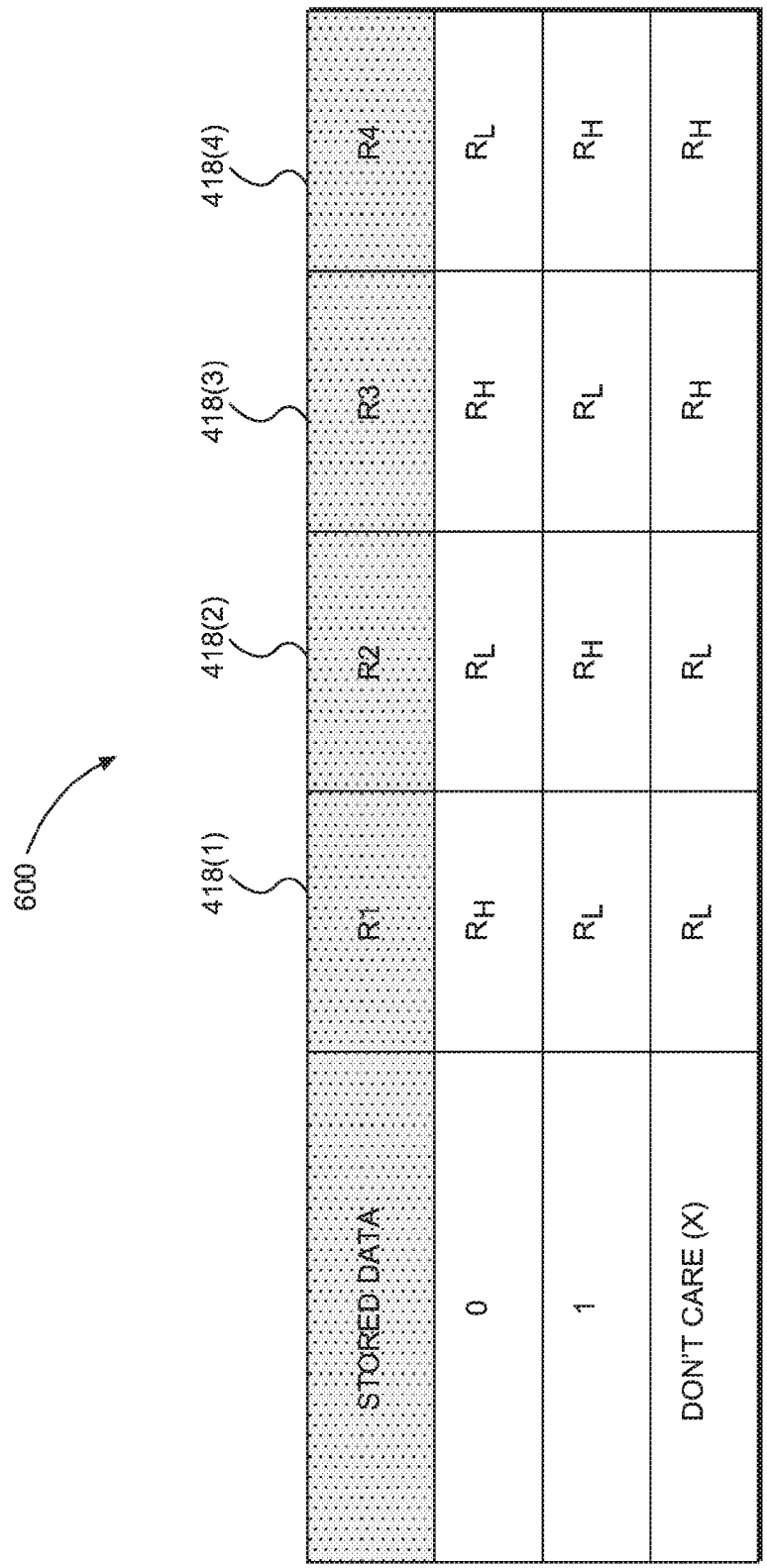
FIG. 6 is a chart illustrating resistive states of MTJ devices in a differential MTJ cell circuit in the NV-CAM cell in FIG. 4 for match, mismatch, and don't care conditions.

FIG. 6 provides a table 600 that illustrates resistive states, higher resistance ($R_H$) or lower resistance ($R_L$), for each of the MTJ devices 418(1)-418(4) for stored data of logical '0', logical '1', and don't care (X) (for a ternary CAM cell). Note that the resistance state between the first and second MTJ devices 418(1), 418(2) and between the third and fourth MTJ devices 418(3), 418(4) is always opposite for stored data of logical '0' and logical '1'. Further, note that that the resistance state between the first and fourth MTJ devices 418(1), 418(4) and between the second and third MTJ devices 418(2), 418(3) is always opposite for stored data of logical '0' and logical '1'. In a don't care stored data state, the resistance state between the first and second MTJ devices 418(1), 418(2) and between the third and fourth MTJ devices 418(3), 418(4) is the same.

Thus for example, if the search data 416 is a logical '1', and the first MTJ device 418(1) has a lower first resistance R1 (e.g., P state) than the fourth resistance R4 of the fourth MTJ device 418(4) (e.g., AP state), the reference cell voltage Vref will be lower than the data cell voltage Vdata. This is indicative of a match condition between the search data 416 of logical '1' and the NV-CAM cell 400. However, if the first MTJ device 418(1) had a higher first resistance R1 (e.g., AP state) than the fourth resistance R4 of the fourth MTJ device 418(4) (e.g., P state), the reference cell voltage Vref would be higher than the data cell voltage Vdata representing a mismatch condition between the search data 416 of logical '1' and the NV-CAM cell 400.

Similarly, when the complementary search data 416C is in an activation state that couples the second and third MTJ devices 418(2), 418(3) to the reference node (Ref) 404R and the data node (Data) 404D respectively, the second and third resistances R2 and R3 coupled to the reference node (Ref) 404R and the data node (Data) 404D will provide a second differential resistance level (i.e., R2-R3) indicative of a match condition of the search data 416. In response, the reference node (Ref) 404R and the data node (Data) 404D become differential cell voltages in the form of the reference cell voltage Vref and the data cell voltage Vdata that differ from each other based on the difference in respective second and third resistances R2 and R3 coupled to the respective reference node (Ref) 404R and the data node (Data) 404D. The difference in resistance between the second and third resistances R2 and R3 controls the difference between current flowing through the second and third MTJ devices 418(2), 418(3), and thus the reference cell voltage Vref and the data cell voltage Vdata when the complementary search data 416C is in an activation state.

For example, if the search data 416 is a logical '0', and the second MTJ device 418(2) has a lower second resistance R2 (e.g., P state) than the third resistance state R3 of the third MTJ device 418(3) (e.g., AP state), the reference cell voltage Vref will be lower than the data cell voltage Vdata. This is indicative of a match condition between the search data 416 of logical '0' and the NV-CAM cell 400. However, if the second MTJ device 418(2) had a higher second resistance state R2 (e.g., AP state) than the third resistance R3 of the third MTJ device 418(3) (e.g., P state), the reference cell voltage Vref would be higher than the data cell voltage Vdata representing a mismatch condition between the search data 416 of logical '0' and the NV-CAM cell 400.

As discussed above, the differential MTJ cell circuit 412 is configured to provide differential resistances and thus differential cell voltages, the reference cell voltage Vref and data cell voltage Vdata on the respective reference node (Ref) 404R and data node (Data) 404D. These differential cell voltages represent the cell voltage margin between match and mismatch conditions of the differential MTJ cell circuit 412. However, it may be desired to increase the cell voltage margin between match and mismatch conditions, including all the way between voltage Vdd and ground (GND), to further increase the cell voltage margin of the NV-CAM cell 400. As discussed above, the NV-CAM cell 400 having a larger sense margin can mitigate sensing issues for increased search operation reliability.

In this regard, with continuing reference to FIG. 4, the NV-CAM cell 400 also includes a cross-coupled MOS amplifier circuit 422. The cross-coupled MOS amplifier circuit 422 is configured to amplify the reference cell voltage Vref and data cell voltage Vdata oppositely to provide an increased cell voltage margin in the NV-CAM cell 400 for increased search performance and reliability. As shown in FIG. 4, the cross-coupled MOS amplifier circuit 422 in this example includes a first transistor 424(1), provided in the form of a PMOS. The cross-coupled MOS amplifier circuit 422 in this example also includes a second transistor 424(2) provided in the form of a PMOS. The drains S1, S2 of the respective first and second transistors 424(1), 424(2) coupled to the respective reference node (Vref) 404R and data node (Data) 404D are cross-coupled to the gates G1, G2 of each other. In this regard, the first transistor 424(1) is configured to be activated in response to the data cell voltage Vdata on the data node (Data) 404D being a lower voltage level than the reference cell voltage Vref, indicating a mismatch condition with the search data 416. In this scenario, the first transistor 424(1) couples the global bit line GBL to the reference node (Ref) 404R to pull up the reference cell voltage Vref to the voltage $V_{DD}$ of the global bit line GBL. Note that the first and second transistors 424(1), 424(2) could alternatively be NMOS transistors.

With continuing reference to FIG. 4, in a positive feedback manner, the reference cell voltage Vref being coupled to the gate G2 of the second transistor 424(2) of the cross-coupled MOS amplifier circuit 422 deactivates the second transistor 424(2) to decouple the data node (Data) 404D from the global bit line GBL to drive the data cell voltage Vdata to the voltage of the second bit line BL2, which may be at ground (GND). Similarly, the second transistor 424(2) is configured to be activated in response to the reference cell voltage (Vref) on the reference node (Ref) 404R being a lower voltage level than the data cell voltage Vdata, indicating a match condition with the search data 416. In this scenario, the second transistor 424(2) couples the global bit line GBL to the data node (Data) 404D to pull up the data cell voltage Vdata to the voltage $V_{DD}$ of the global bit line GBL. In a positive feedback manner, the data cell voltage Vdata being coupled to the gate G1 of the first transistor 424(1) deactivates the first transistor 424(1) to decouple the reference node (Ref) 404R from the global bit line GBL to drive the reference cell voltage Vref to the voltage of the first bit line BL1, which may be at ground (GND). In this manner, the cross-coupled MOS amplifier circuit 422 increases the voltage cell margin between match and mismatch conditions in the NV-CAM cell 400.

With continuing reference to FIG. 4, the data cell voltage Vdata on the data node (Data) 404D is used to indicate the match condition of the NV-CAM cell 400 with the search data 416. The data node (Data) 404D is coupled to a gate G of a decoupling transistor 426 in this example. In this example, the decoupling transistor 426 is provided in lieu of a keeper transistor. By the data node (Data) 404D being coupled to the gate G of the decoupling transistor 426, reverse current between the source and drain of the decoupling transistor 426 is not leaked backed to the data node (Data) 404D, thereby reducing the voltage differential on the match line (ML) between match and mismatch conditions. The decoupling transistor 426 drives a match line (ML) that can be sensed by a separate sense circuit to determine the match condition of the NV-CAM cell 400. The decoupling transistor 426 is configured to be deactivated in response to data cell voltage Vdata being at or above the threshold voltage of the decoupling transistor 426. Thus, the NV-CAM cell 400 is configured such that for a match condition, the data cell voltage Vdata is driven high by the cross-coupled MOS amplifier circuit 422 such that the decoupling transistor 426 is deactivated to prevent or reduce reverse current leakage from the match line (ML), which would reduce the differential voltage (i.e., voltage margin) on the match line (ML) for match and mismatch conditions. Likewise, the NV-CAM cell 400 is also configured such that for a mismatch condition, the data cell voltage Vdata is driven low by the cross-coupled MOS amplifier circuit 422 such that the decoupling transistor 426 is activated to drive the match line (ML). By the data node (Data) 404D being coupled to the gate G of the decoupling transistor 426, reverse current between the source and drain of the decoupling transistor 426 is not leaked backed to the data node (Data) 404D, thereby reducing the voltage differential on the match line (ML) between match and mismatch conditions.

Figure 7A:
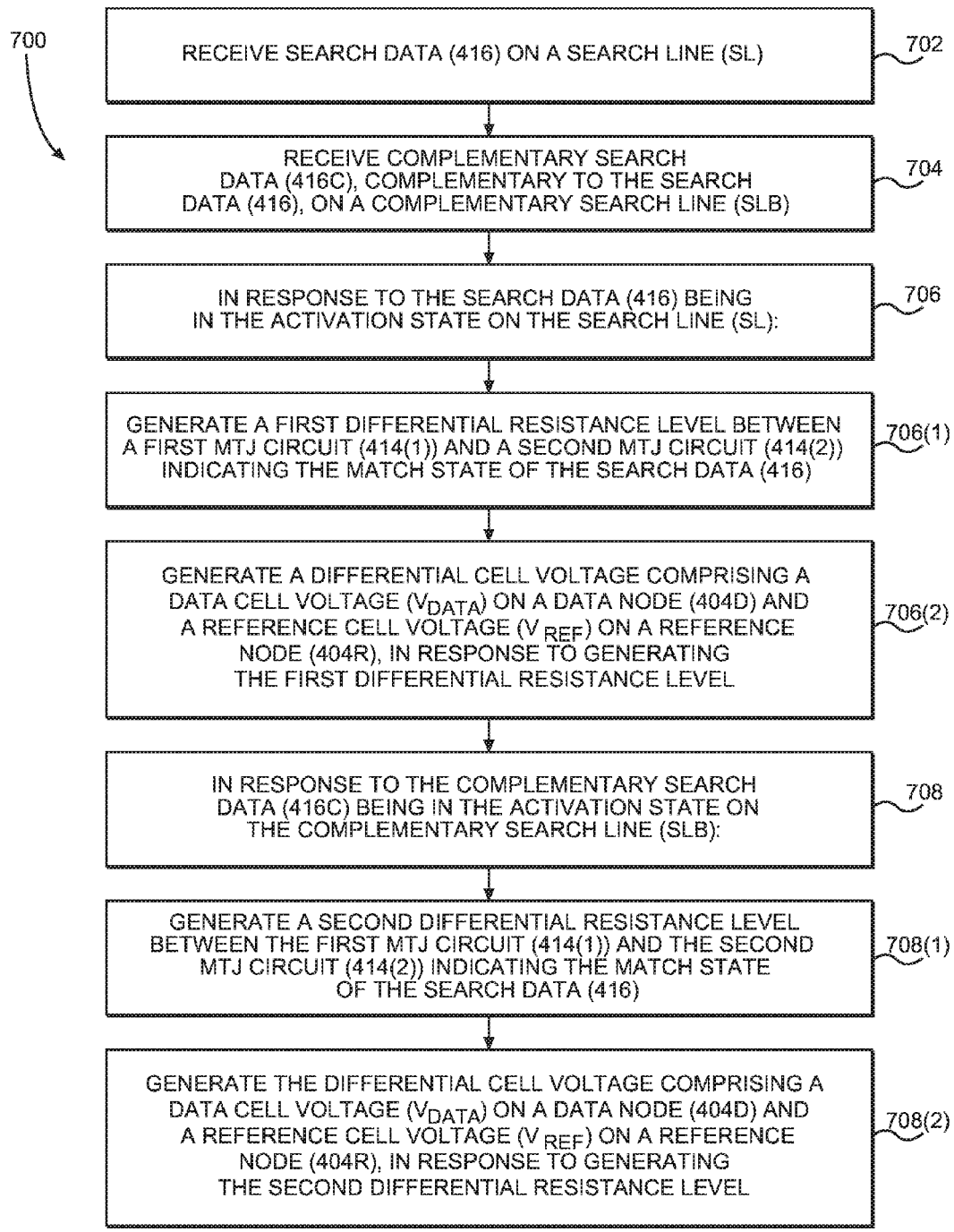
FIGS. 7A and 7B are flowcharts illustrating an exemplary process of the NV-CAM cell in FIG. 4 performing a search operation.
Figure 7B:
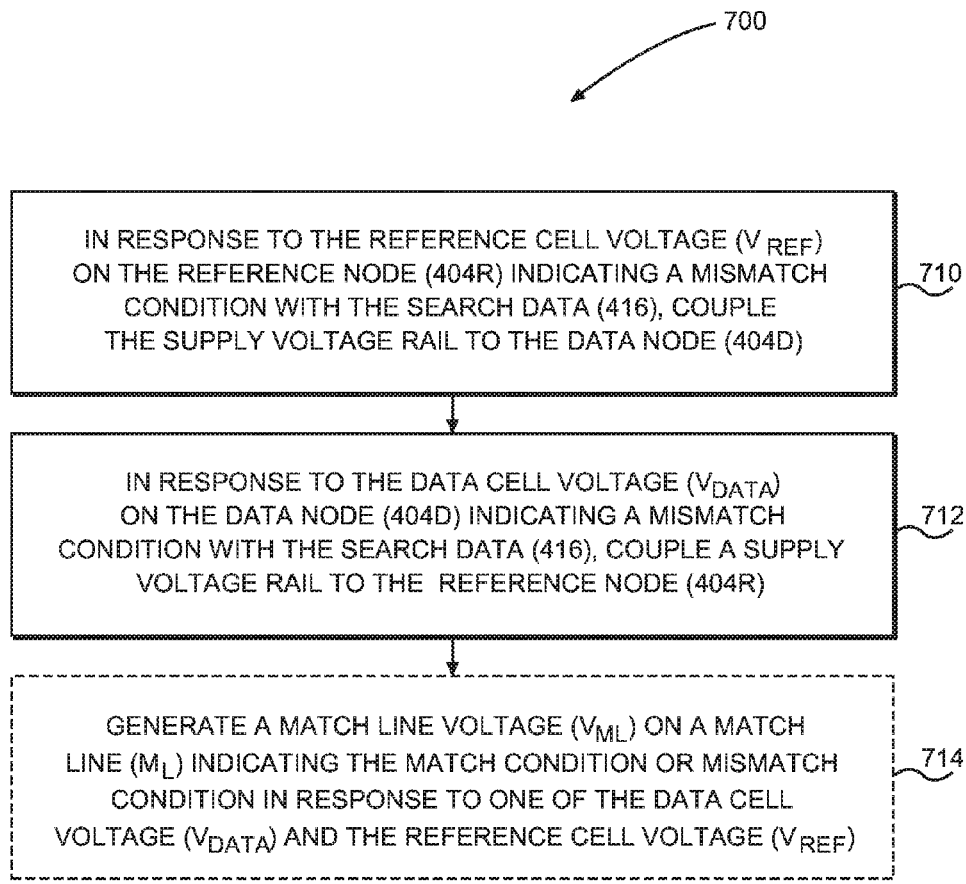

FIGS. 7A and 7B are flowcharts illustrating an exemplary process 700 of the NV-CAM cell 400 in FIG. 4 performing a search operation. In this regard, the NV-CAM cell 400 receives the search data 416 on the search line SL in response to a search operation (block 702 in FIG. 7A). The NV-CAM cell 400 also receives the complementary search data 416C, complementary to the search data 416, on the complementary search line SLB in response to the search operation (block 704 in FIG. 7A). In response to the search data 416 being in the activation state on the search line SL (block 706 in FIG. 7A), the NV-CAM cell 400 generates a first differential resistance level between the first MTJ circuit 414(1) and the second MTJ circuit 414(2) indicating the match condition of the search data 416 (block 706(1) in FIG. 7A). The NV-CAM cell 400 also generates a differential cell voltage comprising a data cell voltage Vdata on the data node (Data) 404D and the reference cell voltage Vref on the reference node (Ref) 404R, in response to generating the first differential resistance level (block 706(2) in FIG. 7A). However, in response to the complementary search data 416C being in the activation state on the complementary search line SLB (block 708 in FIG. 7A), the NV-CAM cell 400 generates a second differential resistance level between the first MTJ circuit 414(1) and the second MTJ circuit 414(2) indicating the match condition of the search data 416 (block 708(1) in FIG. 7A). The NV-CAM cell 400 also generates the differential cell voltage comprising the data cell voltage Vdata on the data node (Data) 404D and the reference cell voltage Vref on the reference node (Ref) 404R, in response to generating the second differential resistance level (block 708(2) in FIG. 7A). In response to the reference cell voltage Vref on the reference node (Ref) 404R indicating a mismatch condition with the search data 416 as the mismatch condition, the supply voltage rail is coupled to the data node (Data) 404D (block 710 in FIG. 7B). In response to the data cell voltage Vdata on the data node (Data) 404D indicating a mismatch condition with the search data 416, the supply voltage rail is coupled to the reference node (Ref) 404R (block 712 in FIG. 7B). In this example, the NV-CAM cell 400 generates a match line voltage $V_{ML}$ on the match line (ML) indicating the match condition (block 714 in FIG. 7B).

FIG. 8A is a circuit diagram of a CAM 800 that includes a plurality of NV-CAM cells employing MTJ differential sensing, such as the NV-CAM cell 400 in FIG. 4. The CAM 800 can be a binary CAM or a ternary CAM, as examples. As shown in FIG. 8A, the NV-CAM cells 400 are coupled to a match line ML. A sense amplifier 802 is coupled to the match line ML to sense the match condition of the CAM 800 in response to a search operation. To pre-charge the match line ML in a pre-charge mode of a search operation, a pre-charge circuit 804 is provided that is configured to pre-charge the match line ML in this example to voltage $V_{DD}$ in a pre-charge operation. The pre-charge circuit 804 is provided as a PMOS in this example, so the pre-charge signal (Pre) 408 is an active low signal to indicate a pre-charge mode. The pre-charge circuit 804 is similar to the pre-charge circuit 402 in the NV-CAM cell 400 in FIG. 4. To illustrate the voltage margin of the CAM 800 employing the NV-CAM cell 400, FIG. 8B is provided. FIG. 8B is a timing diagram 806 illustrating the pre-charge and evaluation modes of a search operation of the NV-CAM cells 400 in the CAM 800 in FIG. 8A, and further illustrating the voltage margin on the match line (ML) between match and mismatch conditions. As shown therein, the voltage margin of the match line voltage $V_{ML}$ between the match and mismatch conditions may be as large as approximately 0.6 Volts (V) to 0.7 V at $V_{DD}$ of 1.0 V, for example.

Figure 9:
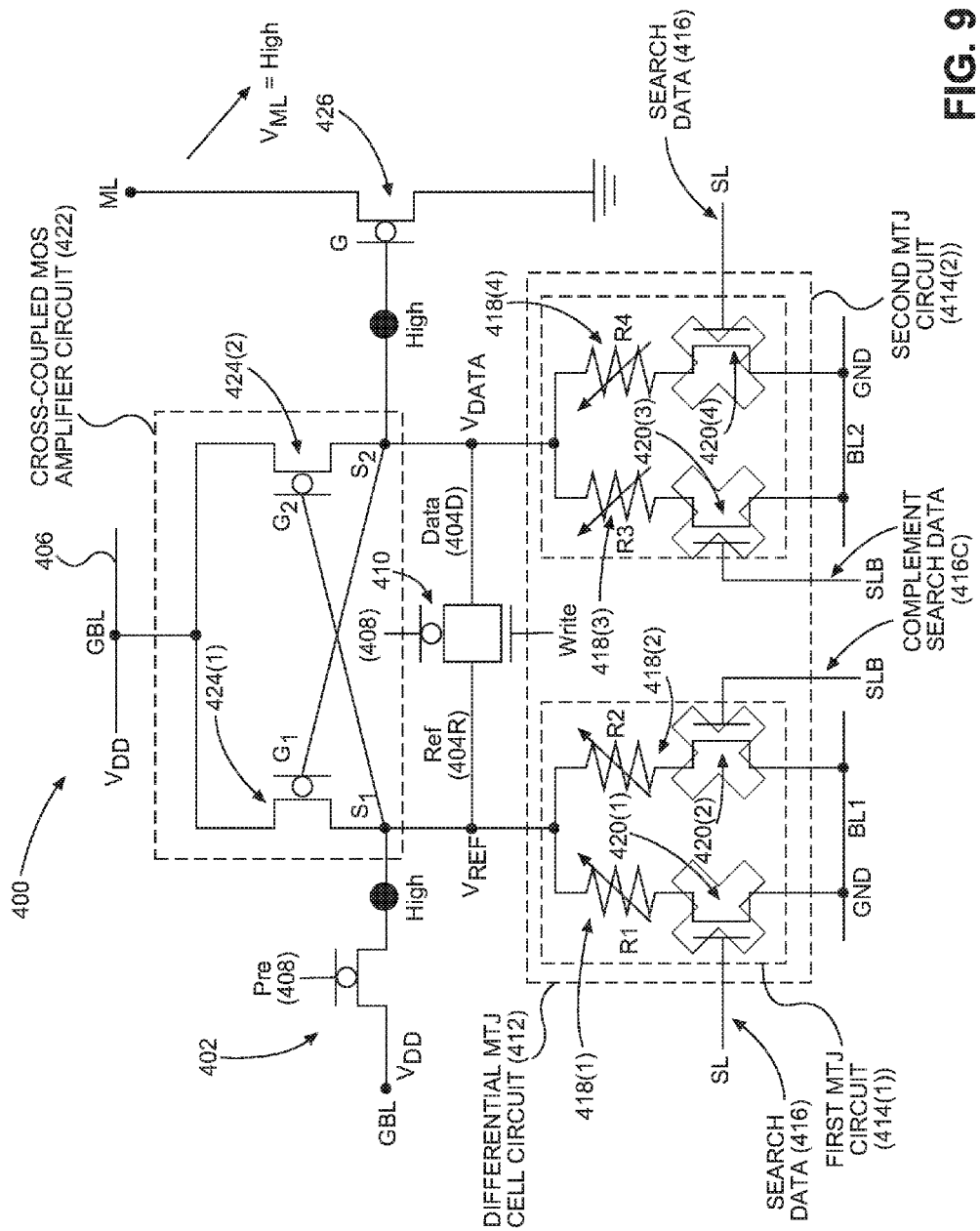
FIG. 9 illustrates a pre-charge mode for a search operation in the NV-CAM cell in FIG. 4.

To further illustrate the search operation of the NV-CAM cell 400 in FIG. 4, FIGS. 9-10C are provided. FIG. 9 illustrates a pre-charge mode for a search operation in the NV-CAM cell 400 in FIG. 4. As shown therein, during a pre-charge mode, the search data 416 and complementary search data 416C are controlled such that the access circuits 420(1)-420(4) are deactivated. This decouples the MTJ devices 418(1)-418(4) from the reference node (Ref) 404R and the data node (Data) 404D. In response to the pre-charge signal (Pre) 408 indicating a pre-charge mode to activate the pre-charge circuit 402, voltage $V_{DD}$ (High) is coupled to the reference node (Ref) 404R to charge the reference node (Ref) 404R. The equalizer circuit 410 is configured to couple the reference node (Ref) 404R to the data node (Data) 404D in response to the pre-charge signal (Pre) 408 indicating the pre-charge mode to also charge the data node (Data) 404D to voltage $V_{DD}$ (High). The match line (ML) is also pre-charged to a match line voltage $V_{ML}$ (High) by a separate pre-charge circuit, such as the pre-charge circuit 804 in FIG. 8A described above.

Figure 10A:
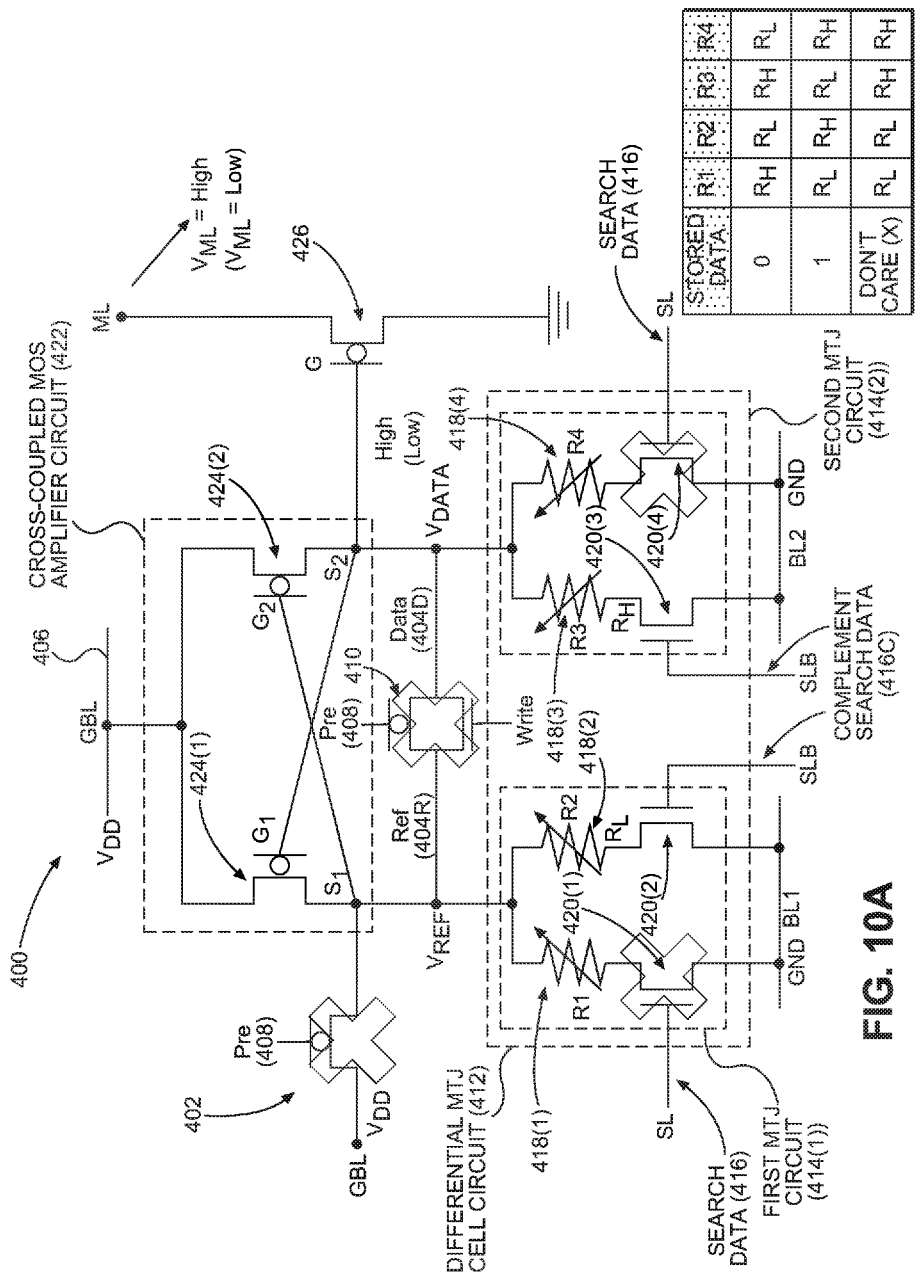
FIG. 10A illustrates an evaluation mode for a search operation of '0' search data in the NV-CAM cell in FIG. 4.

FIG. 10A illustrates an evaluation mode for a search operation of '0' search data in the NV-CAM cell 400 in FIG.

4. The search data 416 is logical '0' and thus, the complementary search data 416C is logical '1'. In response, the second and third access circuits 420(2), 420(3) are activated, thereby coupling the MTJ devices 418(2), 418(3) to the reference node (Ref) 404R and data node (Data) 404D, respectively. The pre-charge signal (Pre) 408 is not in the pre-charge mode, thus causing the pre-charge circuit 402 and the equalizer circuit 410 to be deactivated from decoupling the global bit line GBL from the reference node (Ref) 404R, and the reference node (Ref) 404R from the data node (Data) 404D. A higher data cell voltage Vdata on the data node (Data) 404D indicates a match condition between search data 416 of logical '0' and the stored data in the NV-CAM cell 400, as shown in the chart in FIG. 10A. A lower data cell voltage Vdata on the data node (Data) 404D indicates a mismatch condition between search data 416 of logical '0' and the stored data in the NV-CAM cell 400, as also shown in the chart in FIG. 10A. As previously discussed, the data cell voltage Vdata controls the gate G of the decoupling transistor 426 to drive the match line (ML) to a higher match line voltage $V_{ML}$ for a match condition, and to a lower match line voltage $V_{ML}$ for a mismatch condition.

Figure 10B:
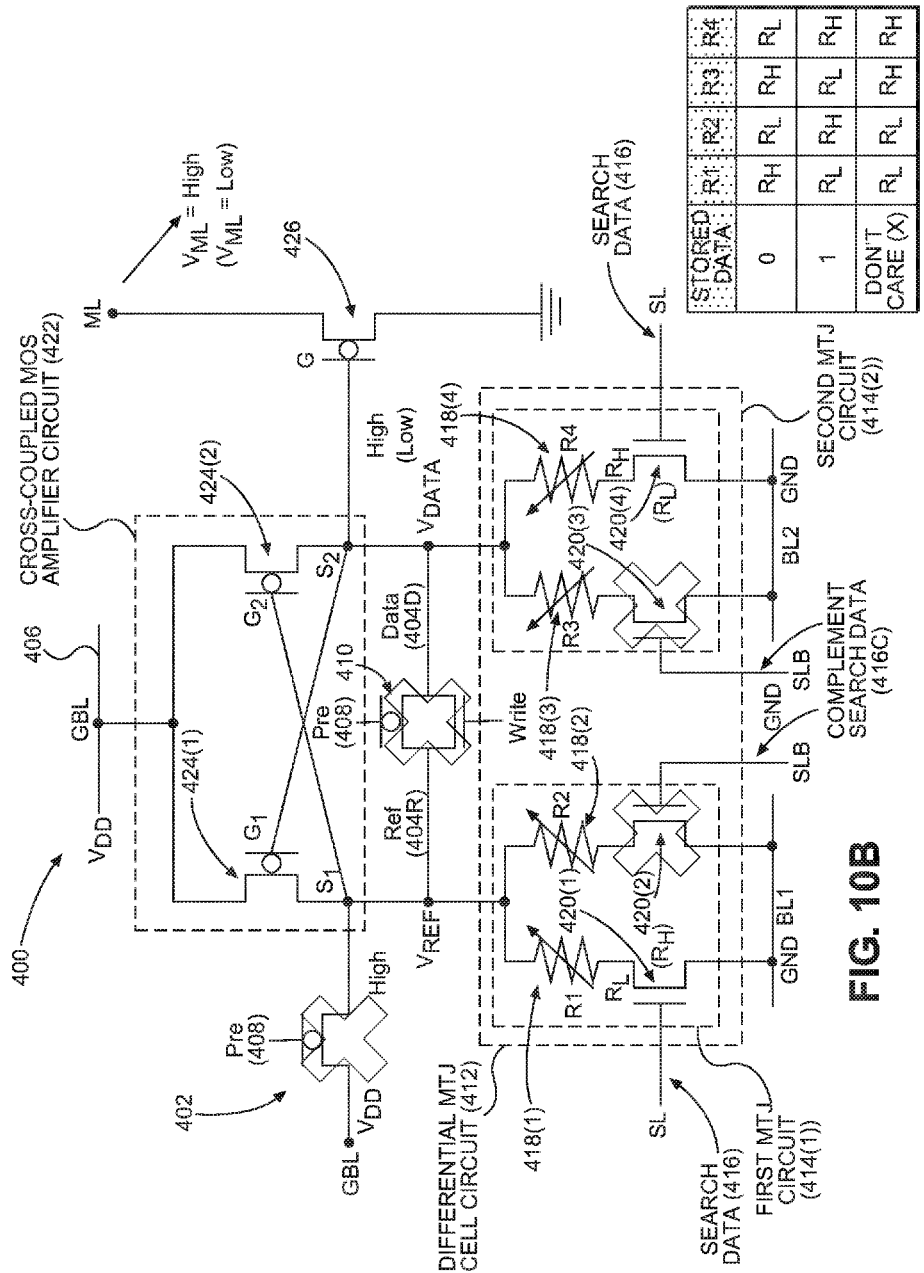
FIG. 10B illustrates an evaluation mode for a search operation of '1' search data in the NV-CAM cell in FIG. 4.

FIG. 10B illustrates an evaluation mode for a search operation of '1' search data 416 in the NV-CAM cell 400 in FIG. 4. The search data 416 is logical '1' and thus, the complementary search data 416C is logical '0'. In response, the first and fourth access circuits 420(1), 420(4) are activated, thereby coupling the MTJ devices 418(1), 418(4) to the reference node (Ref) 404R and data node (Data) 404D, respectively. The pre-charge signal (Pre) 408 is not in the pre-charge mode, thus causing the pre-charge circuit 402 and the equalizer circuit 410 to be deactivated from decoupling the global bit line GBL from the reference node (Ref) 404R, and the reference node (Ref) 404R from the data node (Data) 404D. A higher data cell voltage Vdata on the data node (Data) 404D indicates a match condition between search data 416 of logical '1' and the stored data in the NV-CAM cell 400, as shown in the chart in FIG. 10B. A lower data cell voltage Vdata on the data node (Data) 404D indicates a mismatch condition between search data 416 of logical '1' and the stored data in the NV-CAM cell 400, as also shown in the chart in FIG. 10B.

Figure 10C:
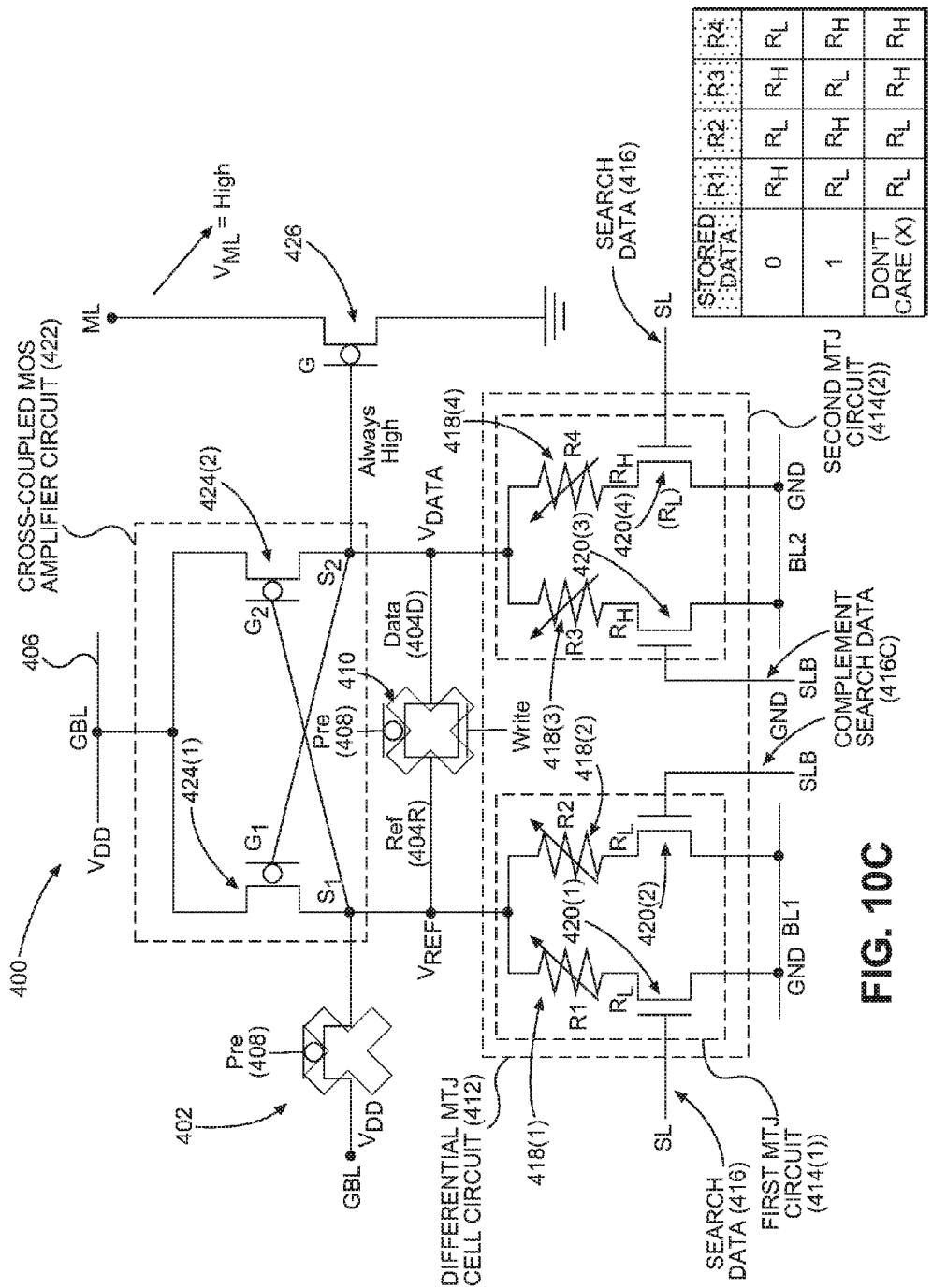
FIG. 10C illustrates an evaluation mode for a search operation of don't care 'X' search data in the NV-CAM cell in FIG. 4.

FIG. 10C illustrates an evaluation mode for a search operation of don't care 'X' search data 416 in the NV-CAM cell 400 in FIG. 4. In a don't care "X" data storage in the NV-CAM cell 400, the first and second MTJ devices 418(1), 418(2) are configured in a P state of lower resistance $R_L$. The third and fourth MTJ devices 418(3), 418(4) are configured in an AP state of higher resistance $R_H$. Thus, the data node (Data) 404D will always be driven to a higher data cell voltage Vdata regardless of the search data 416 and complementary search data 416 to indicate a match condition, because at least one of the third and fourth MTJ devices 418(3), 418(4) will be coupled to the data node (Data) 404D to cause the cross-coupled MOS amplifier circuit 422 to drive the data cell voltage Vdata to the higher voltage (e.g., to voltage $V_{DD}$).

Figure 2B:
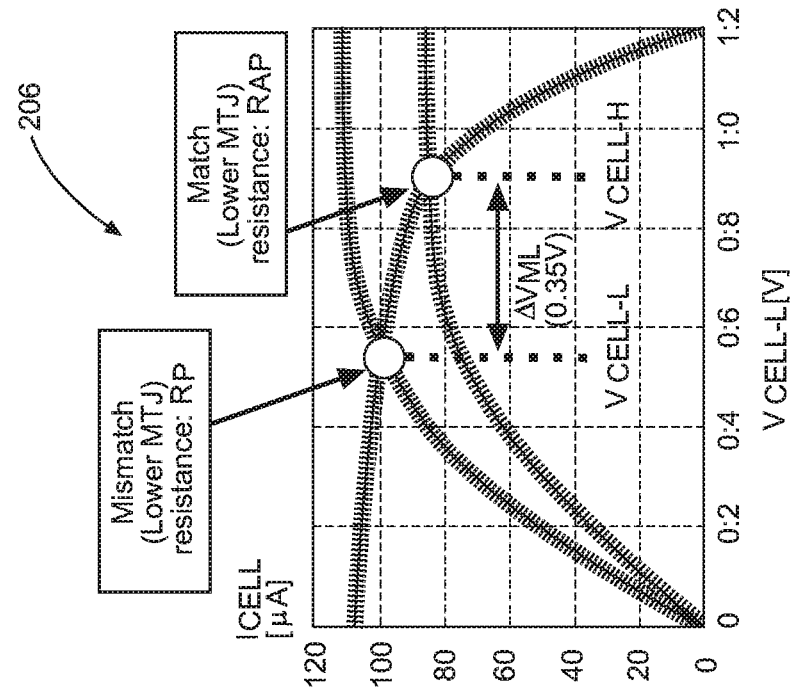
FIG. 2B is a graph illustrating exemplary cell current ($I_{CELL}$) versus cell voltage ($V_{CELL}$) curves for match and mismatch conditions between search data and stored data in the 6T-2MTJ NV-TCAM cell in FIG. 2A.
Figure 2A:
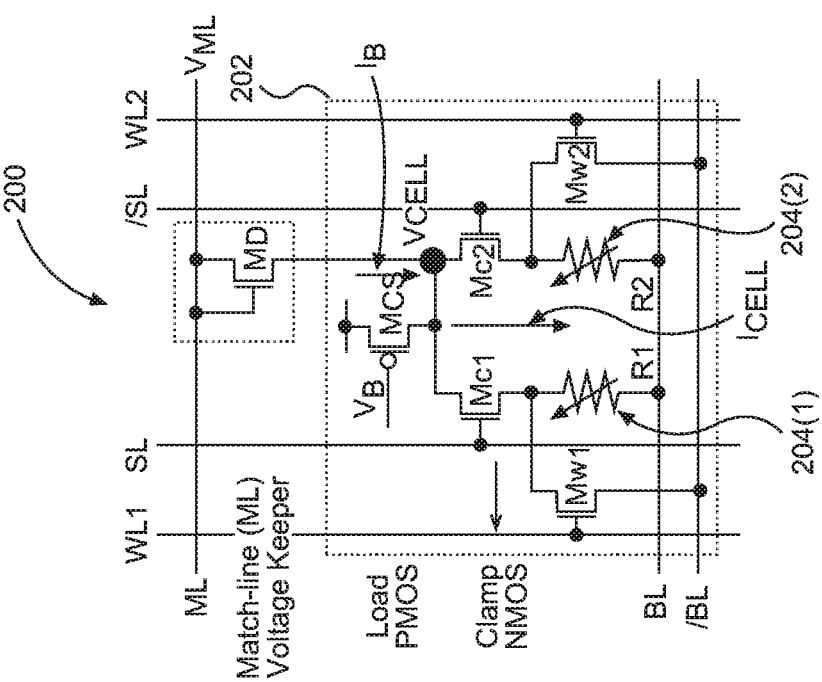
FIG. 2A is a circuit diagram of an exemplary six (6) transistor (T) (6T)-two (2) magnetic tunnel junction (MTJ) (2MTJ) non-volatile (NV)-ternary CAM (TCAM) (6T-2MTJ NV-TCAM) cell.
Figure 3A:
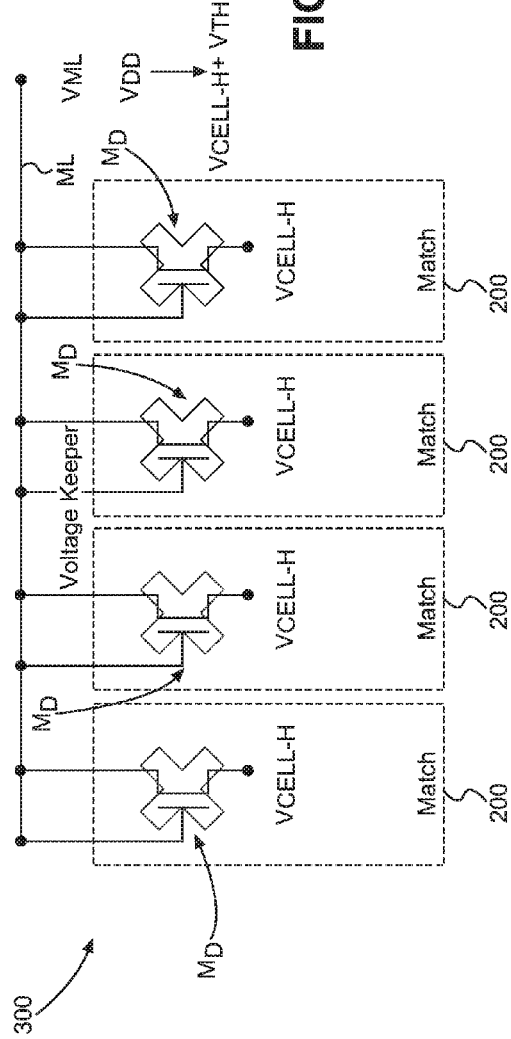
FIGS. 3A and 3B illustrate differences in discharged voltages between match and mismatch conditions on a match line (ML) of a 6T-2MTJ NV-TCAM cell array in a TCAM to illustrate sense margin of the TCAM.
Figure 3B:
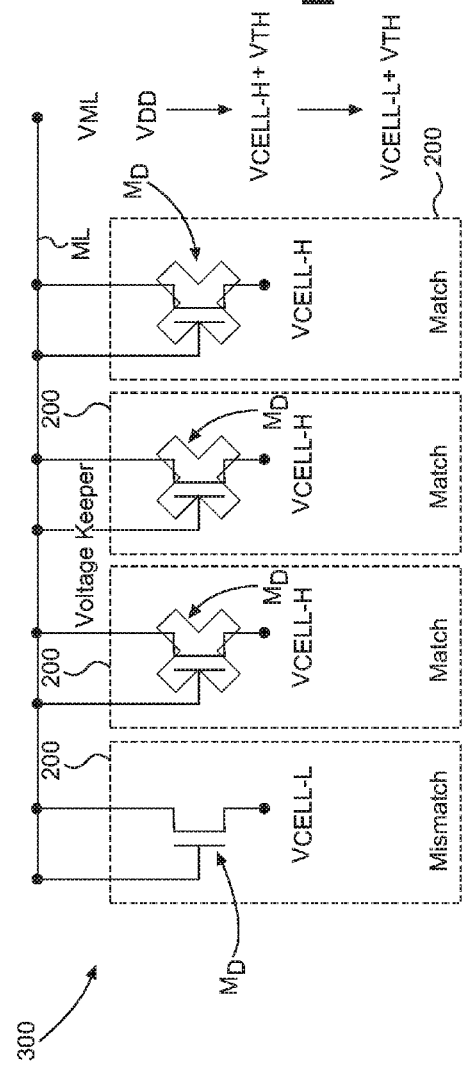
Figure 11A:
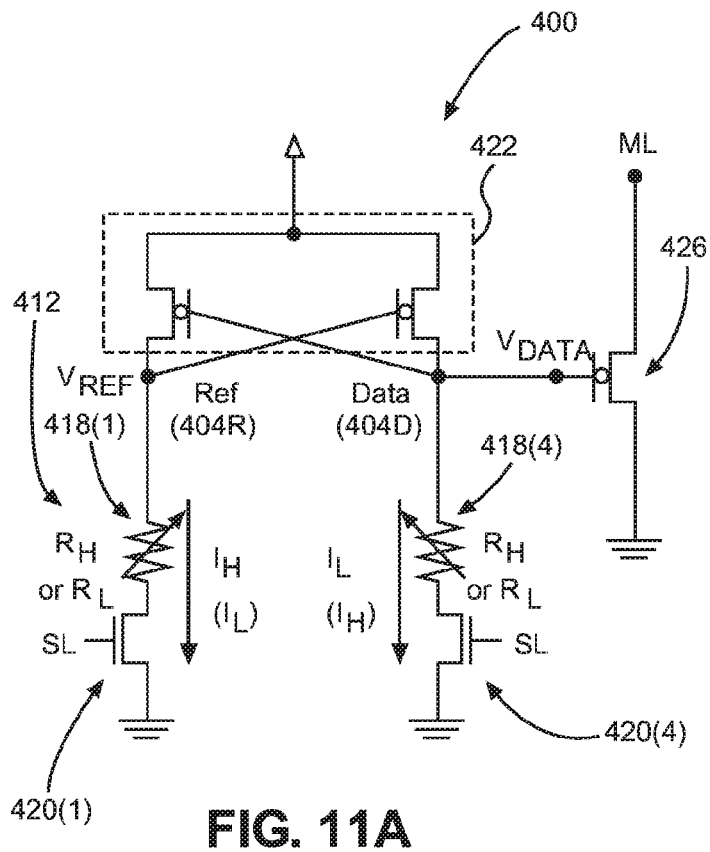
FIG. 11A is circuit diagram illustrating differential cell voltages in the NV-CAM cell in FIG. 4 determined by differential cell currents in a differential MTJ cell circuit as a result of a search operation.
Figure 11B:
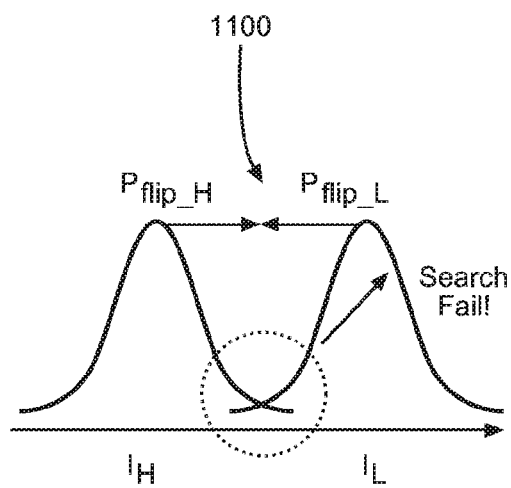
FIG. 11B is a graph illustrating search failure probability in the NV-CAM cell in FIG. 4 as a function of differential cell currents in a differential MTJ cell circuit as a result of a search operation.

FIG. 11A is circuit diagram illustrating differential cell voltages in the NV-CAM cell 400 in FIG. 4 determined by the differential cell currents in the differential MTJ cell circuit 412 as a result of a search operation. The example in FIG. 11A is for search data 416 being a logical '1' such that the first and fourth MTJ devices 418(1), 418(4) are coupled to the reference node (Ref) 404R and the data node (Data) 404D. As shown therein, the data cell voltage Vdata is determined by current difference between current $I_L$ and $I_H$ flowing through the first and fourth MTJ devices 418(1), 418(4) in the lower and higher resistance states of the first and fourth MTJ devices 418(1), 418(4), respectively. Thus, the search failure of the NV-CAM cell 400 is a product of $P_{flip\_L}$ and $P_{flip\_H}$ as shown in a graph 1100 in FIG. 11B, because the MTJ devices 418(4), 418(1) coupled to the data node (Data) 404D and the reference node (Ref) 404R are always written to opposite states. Thus, the search failure probability of the NV-CAM cell 400 is lower than that of a 6T-2MTJ CAM cell 200 in FIG. 2A, as an example.

Figure 12A:
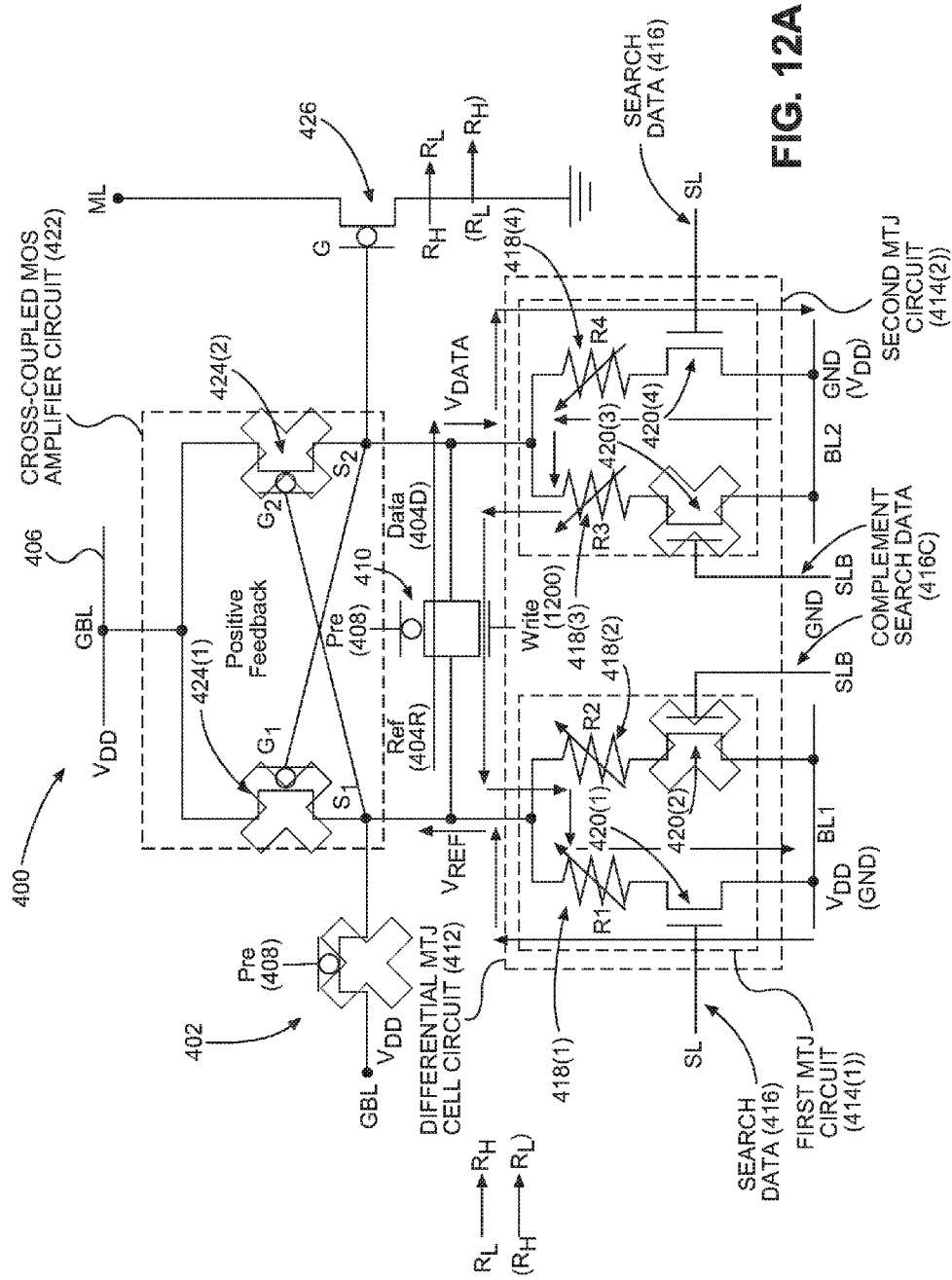
FIG. 12A illustrates a write operation for first and fourth MTJ devices in respective first and second MTJ circuits in a differential MTJ cell circuit in the NV-CAM cell in FIG. 4.
Figure 12B:
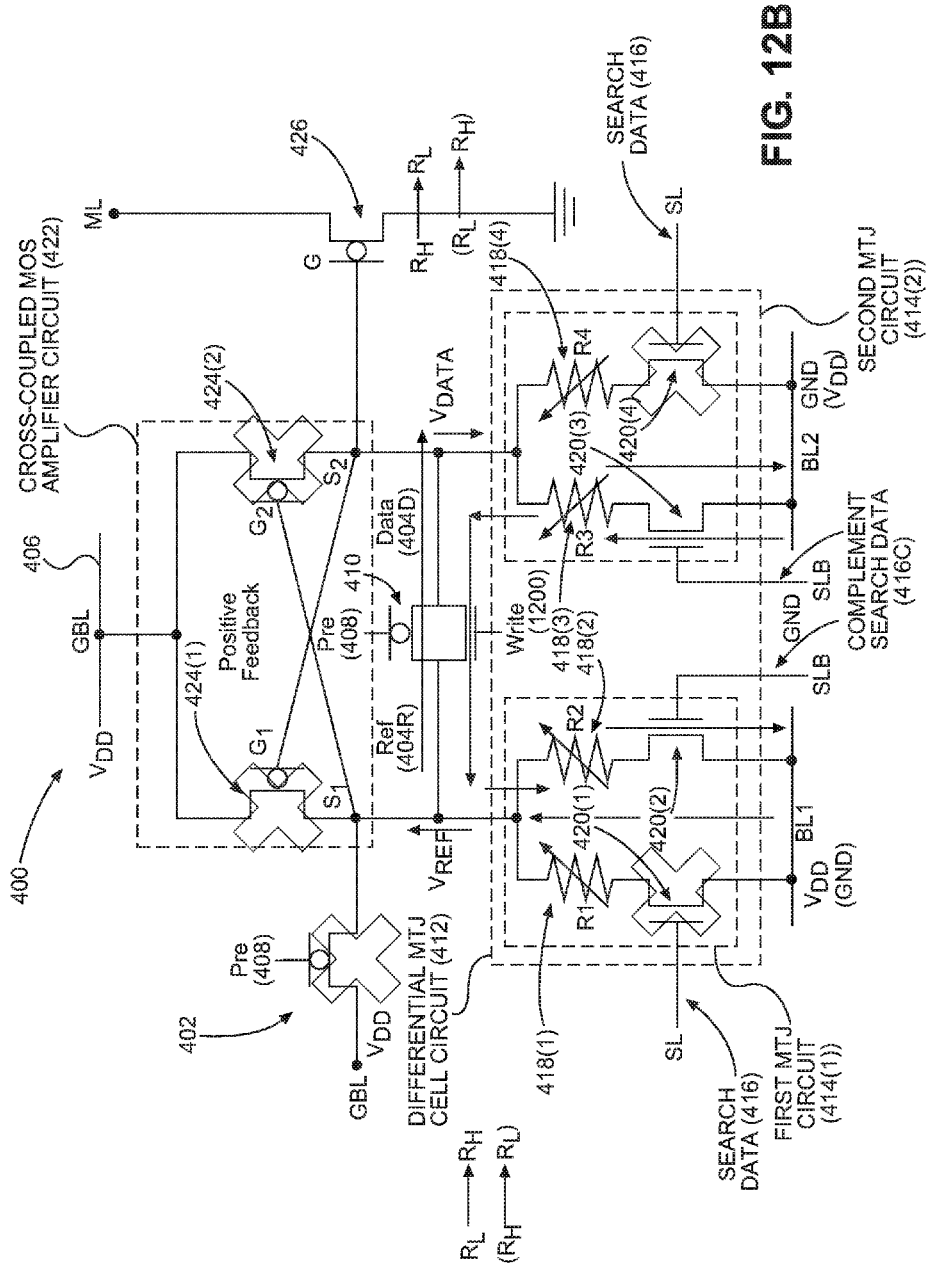
FIG. 12B illustrates a write operation for second and third MTJ devices in respective first and second MTJ circuits in a differential MTJ cell circuit in the NV-CAM cell in FIG. 4.

The NV-CAM cell 400 is also configured to store data in response to a write operation. In this regard, FIG. 12A illustrates a write operation for the first and fourth MTJ devices 418(1), 418(4) in the differential MTJ cell circuit 412 in the NV-CAM cell 400. FIG. 12B illustrates a write operation for the second and third MTJ devices 418(2), 418(3) in the differential MTJ cell circuit 412 in the NV-CAM cell 400. As shown in FIG. 12A, in response to a write operation, the pre-charge signal (Pre) 408 is in a deactivation state, which deactivates the pre-charge circuit 402. A write signal 1200 activates the equalizer circuit 410 to couple the reference node (Ref) 404R and the data node (Data) 404D. To apply write data and complementary write data to change the first and fourth MTJ devices 418(1), 418(4) from a lower resistance state $R_L$ to a higher resistance state $R_H$, and vice versa (to be in opposite states), respectively, the first bit line BL1 is driven with a voltage $V_{DD}$ and the second bit line BL2 is driven to ground (GND) voltage as write data and complementary write data, respectively. This causes current to flow from the first bit line BL1 to the second bit line BL2. To apply write data and complementary write data to change the first and fourth MTJ devices 418(1), 418(4) from a higher resistance state $R_H$ to a lower resistance state $R_L$, and vice versa (to be in opposite states), respectively, the first bit line BL1 is driven to ground (GND) voltage and the second bit line BL2 is driven to voltage $V_{DD}$ as write data and complementary write data, respectively. This causes current to flow from the second bit line BL2 to the first bit line BL1.

FIG. 12B illustrates a write operation for the second and third MTJ devices 418(2), 418(3) in the differential MTJ cell circuit 412 in the NV-CAM cell 400. As shown in FIG. 12B, in response to a write operation, the pre-charge signal (Pre) 408 is in a deactivation state, which deactivates the pre-charge circuit 402. A write signal 1200 activates the equalizer circuit 410 to couple the reference node (Ref) 404R and the data node (Data) 404D. To apply write data and complementary write data to change the second and third MTJ devices 418(2), 418(3) from a lower resistance state $R_L$ to a higher resistance state $R_H$, and vice versa (to be in opposite states), respectively, the first bit line BL1 is driven with a voltage $V_{DD}$ and the second bit line BL2 is driven to ground (GND) voltage as write data and complementary write data, respectively. This causes current to flow from the first bit line BL1 to the second bit line BL2. To apply write data and complementary write data to change the second and third MTJ devices 418(2), 418(3) from a higher resistance state $R_H$ to a lower resistance state $R_L$, and vice versa (to be in opposite states), respectively, the first bit line BL1 is driven to ground (GND) voltage and the second bit line BL2 is driven to voltage $V_{DD}$ as write data and complementary write data, respectively. This causes current to flow from the second bit line BL2 to the first bit line BL1.

A CAM that includes NV-CAM cells that employ MTJ differential sensing to provide differential cell voltages for match and mismatch conditions, wherein the differential cell voltages are further amplified to provide an increased differential cell voltage margin and thus a larger sense margin, including but not limited to the 10T-4MTJ NV-TCAM 400 in FIG. 4, may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

In this regard, FIG. 13 illustrates an example of a processor-based system 1300 that can include a CAM that employs NV-TCAM cells employing MTJ differential sensing to provide differential cell voltages for match and mismatch conditions, wherein the differential cell voltages are further amplified to provide an increased differential cell voltage margin and thus a larger sense margin, including but not limited to the 10T-4MTJ NV-TCAM 400 in FIG. 4. In this example, the processor-based system 1300 includes a processor 1302 that includes one or more CPUs 1304. The processor 1302 may have cache memory 1306 coupled to the CPU(s) 1304 for rapid access to temporarily stored data. The processor 1302 may include a CAM 1308 that employs NV-TCAM cells employing MTJ differential sensing to provide differential cell voltages for match and mismatch conditions, wherein the differential cell voltages are further amplified to provide an increased differential cell voltage margin and thus a larger sense margin, including but not limited to the 10T-4MTJ NV-TCAM 400 in FIG. 4.

The processor 1302 is coupled to a system bus 1310 and can intercouple master and slave devices included in the processor-based system 1300. As is well known, the processor 1302 communicates with these other devices by exchanging address, control, and data information over the system bus 1310. Although not illustrated in FIG. 13, multiple system buses 1310 could be provided, wherein each system bus 1310 constitutes a different fabric. For example, the processor 1302 can communicate bus transaction requests to a memory system 1312 as an example of a slave device. The memory system 1312 may include a memory controller 1314 that controls access to a memory array 1316. The memory system 1312 could also include a CAM 1318 that employs NV-TCAM cells employing MTJ differential sensing to provide differential cell voltages for match and mismatch conditions, wherein the differential cell voltages are further amplified to provide an increased differential cell voltage margin and thus a larger sense margin, including but not limited to the 10T-4MTJ NV-TCAM 400 in FIG. 4 as an example.

Other master and slave devices can be connected to the system bus 1310. As illustrated in FIG. 13, these devices can include the memory system 1312, one or more input devices 1320, one or more output devices 1322, one or more network interface devices 1324, and one or more display controllers 1326. The input device(s) 1320 can include any type of input device, including but not limited to input keys, switches, voice processors, etc. The output device(s) 1322 can include any type of output device, including but not limited to audio, video, other visual indicators, etc. The network interface device(s) 1324 can be any devices configured to allow exchange of data to and from a network 1328. The network 1328 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1324 can be configured to support any type of communications protocol desired.

The processor 1302 may also be configured to access the display controller(s) 1326 over the system bus 1310 to control information sent to one or more displays 1330. The display controller(s) 1326 sends information to the display(s) 1330 to be displayed via one or more video processors 1332, which process the information to be displayed into a format suitable for the display(s) 1330. The display controller 1326 and/or the video processor(s) 1332 can include a CAM 1334 that employs NV-TCAM cells employing MTJ differential sensing to provide differential cell voltages for match and mismatch conditions, wherein the differential cell voltages are further amplified to provide an increased differential cell voltage margin and thus a larger sense margin, including but not limited to the 10T-4MTJ NV-TCAM 400 in FIG. 4 as an example. The display(s) 1330 can include any type of display, including but not limited to a cathode ray tube (CRT), a liquid crystal display (LCD), a plasma display, etc.

Further, as an example, the first MTJ circuit 414(1) in the NV-CAM cell 400 in FIG. 4 is an example of a means for generating a first resistance based on a first MTJ resistance, in response to receiving the search data 416 on the search line SL and the complementary search data 416C on the complementary search line SLB. The second MTJ circuit 414(2) is an example of a means for generating a second resistance based on a second MTJ resistance, in response to receiving the search data 416 on the search line SL and the complementary search data 416C on the complementary search line SLB. The differential MTJ cell circuit 412 is also an example of a means for generating a differential cell voltage comprising the data cell voltage Vdata on the data node (Data) 404D and the reference cell voltage Vref on the reference node (Ref) 404R, in response to the first differential resistance level between the means for generating the first resistance and the means for generating the second resistance indicating a match condition of the search data 416, and in response to the search data 416 being in the activation state on the search line SL, and the second differential resistance level between the means for generating the first resistance and the means for generating the second resistance indicating the match condition of the search data 416, in response to the complementary search data 416C being in the activation state on the complementary search line SLB. The cross-coupled MOS amplifier circuit 422 is an example of a means for amplifying the differential cell voltage. An example of the means for amplifying can include the first transistor 424(1) as an example of a first amplifying means for amplifying the data cell voltage Vdata on the data node (Data) 404D in response to the reference cell voltage Vref on the reference node (Ref) 404R indicating a mismatch condition with the search data 416. An example of the means for amplifying can also include the second transistor 424(2), and an example of a second amplifying means for amplifying the reference cell voltage Vref on the reference node (Ref) 404R in response to the data cell voltage Vdata on the data node (Data) 404D indicating a mismatch condition with the search data 416. The decoupling transistor 426 is an example of a means for outputting a match line voltage $V_{ML}$ on a match line (ML) indicating the match condition in response to one of the data cell voltage Vdata and the reference cell voltage Vref.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A non-volatile (NV)-content addressable memory (CAM) cell, comprising:
    a differential magnetic tunnel junction (MTJ) cell circuit, comprising:
        a first MTJ circuit configured to receive search data on a search line and complementary search data, complementary to the search data, on a complementary search line;
        a second MTJ circuit configured to receive the search data on the search line and the complementary search data on the complementary search line; and
        the differential MTJ cell circuit configured to generate a differential cell voltage comprising a data cell voltage on a data node and a reference cell voltage on a reference node, in response to:
            a first differential resistance level between the first MTJ circuit and the second MTJ circuit indicating a match condition of the search data, in response to the search data being in an activation state on the search line; and
            a second differential resistance level between the first MTJ circuit and the second MTJ circuit indicating the match condition of the search data, in response to the complementary search data being in the activation state on the complementary search line; and
    a cross-coupled metal oxide semiconductor (MOS) amplifier circuit, comprising:
        a first transistor configured to be activated in response to the data cell voltage on the data node indicating a mismatch condition with the search data, to couple a supply voltage rail to the reference node; and a second transistor configured to be activated in response to the reference cell voltage on the reference node indicating the match condition with the search data, to couple the supply voltage rail to the data node.

2. The NV-CAM cell of claim 1, further comprising a decoupling transistor configured to be activated in response to one of the data cell voltage and the reference cell voltage to control a voltage level of a match line indicating the match condition or the mismatch condition.

3. The NV-CAM cell of claim 1, wherein:
    the first transistor is further configured to be deactivated in response to the data cell voltage on the data node indicating the match condition with the search data, to decouple the supply voltage rail from the reference node; and
    the second transistor is further configured to be deactivated in response to the reference cell voltage on the reference node indicating the mismatch condition with the search data, to decouple the supply voltage rail from the data node.

4. The NV-CAM cell of claim 1, wherein:
the first MTJ circuit comprises:
   a first MTJ device configured to be coupled between the reference node and a first bit line in response to the search data being in the activation state on the search line; and
   a second MTJ device configured to be coupled between the reference node and the first bit line in response to the complementary search data being in the activation state on the complementary search line; and
the second MTJ circuit comprises:
   a third MTJ device configured to be coupled between the data node and a second bit line in response to the complementary search data being in the activation state on the complementary search line; and
   a fourth MTJ device configured to be coupled between the data node and the second bit line in response to the search data being in the activation state on the search line.

5. The NV-CAM cell of claim 4, wherein:
the first MTJ device is further configured to be decoupled between the reference node and the first bit line in response to the search data being in a deactivation state on the search line;
the second MTJ device is further configured to be decoupled between the reference node and the first bit line in response to the complementary search data being in the deactivation state on the complementary search line;
the third MTJ device is further configured to be decoupled between the data node and the second bit line in response to the complementary search data being in the deactivation state on the complementary search line; and
the fourth MTJ device is further configured to be decoupled between the data node and the second bit line in response to the search data being in the deactivation state on the search line.

6. The NV-CAM cell of claim 4, wherein:
in response to the search data being in the activation state on the search line, the first MTJ device is further configured to generate a first resistance and the fourth MTJ device is further configured to generate a fourth resistance different from the first resistance to provide the first differential resistance level between the first MTJ circuit and the second MTJ circuit indicating the match condition of the search data; and
in response to the complementary search data being in the activation state on the complementary search line, the second MTJ device is further configured to generate a second resistance and the third MTJ device is further configured to generate a third resistance different from the second resistance to provide the second differential resistance level between the first MTJ circuit and the second MTJ circuit indicating the match condition of the search data.

7. The NV-CAM cell of claim 4, wherein:
the first MTJ circuit further comprises:
   a first access circuit configured to selectively control coupling of the first MTJ device between the reference node and the first bit line in response to the search data being in the activation state on the search line; and
   a second access circuit configured to selectively control coupling of the second MTJ device between the reference node and the first bit line in response to the complementary search data being in the activation state on the complementary search line; and
the second MTJ circuit further comprises:
   a third access circuit configured to selectively control coupling of the third MTJ device between the data node and the second bit line in response to the complementary search data in the activation state on the complementary search line; and
   a fourth access circuit configured to selectively control coupling of the fourth MTJ device between the data node and the second bit line in response to the search data being in the activation state on the search line.

8. The NV-CAM cell of claim 4, wherein:
the first MTJ circuit is configured to:
   store write data from the first bit line into the first MTJ device, in response to the write data being asserted on the first bit line and complementary write data being asserted on the second bit line; and
   store write data from the second bit line into the second MTJ device, in response to write data being asserted on the second bit line and complementary write data being asserted on the first bit line; and
the second MTJ circuit is configured to:
   store the write data from the second bit line into the third MTJ device, in response to the write data being asserted on the second bit line and the complementary write data being asserted on the first bit line; and
   store the write data from the first bit line into the fourth MTJ device, in response to the write data being asserted on the first bit line and the complementary write data being asserted on the second bit line.

9. The NV-CAM cell of claim 1, further comprising a pre-charge circuit configured to couple the reference node to the supply voltage rail to pre-charge the reference node and the data node to a supply voltage on the supply voltage rail, in response to a pre-charge signal indicating a pre-charge mode.

10. The NV-CAM cell of claim 9, wherein the differential MTJ cell circuit is further configured to be decoupled from the data node and the reference node in response to the search data being in a deactivation state on the search line and the complementary search data being in the deactivation state on the complementary search line.

11. The NV-CAM cell of claim 1, further comprising an equalizer circuit configured to couple the reference node to the data node in response to a pre-charge signal indicating a pre-charge mode.

12. The NV-CAM cell of claim 2, wherein the decoupling transistor comprises a gate coupled to one of the data node and the reference node, wherein the decoupling transistor is configured to be activated in response to a respective one of the data cell voltage and the reference cell voltage to control the voltage level of the match line indicating the match condition.

13. The NV-CAM cell of claim 1, wherein the first and second transistors of the cross-coupled MOS amplifier circuit are each comprised of P-type MOS (PMOS) transistors.

14. The NV-CAM cell of claim 1, wherein the first and second transistors of the cross-coupled MOS amplifier circuit are each comprised of N-type MOS (NMOS) transistors.

15. The NV-CAM cell of claim 1 comprising a 10T-4MTJ NV-CAM cell.

16. The NV-CAM cell of claim 1 integrated into an integrated circuit (IC).

17. The NV-CAM cell of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

18. A non-volatile (NV)-content addressable memory (CAM) cell, comprising:
- a means for generating a first resistance based on a first magnetic tunnel junction (MTJ) resistance, in response to receiving search data on a search line and complementary search data, complementary to the search data, on a complementary search line; and
- a means for generating a second resistance based on a second MTJ resistance, in response to receiving the search data on the search line and the complementary search data on the complementary search line;
- a means for generating a differential cell voltage comprising a data cell voltage on a data node and a reference cell voltage on a reference node, in response to:
  - a first differential resistance level between the means for generating the first resistance and the means for generating the second resistance indicating a match condition of the search data, in response to the search data being in an activation state on the search line; and
  - a second differential resistance level between the means for generating the first resistance and the means for generating the second resistance indicating the match condition of the search data, in response to the complementary search data being in the activation state on the complementary search line;
- a means for amplifying the differential cell voltage, the means for amplifying comprising:
  - a first amplifying means for amplifying the reference cell voltage on the reference node in response to the data cell voltage on the data node indicating a mismatch condition with the search data; and
  - a second amplifying means for amplifying the data cell voltage on the data node in response to the reference cell voltage on the reference node indicating the match condition with the search data; and
- a means for outputting a match line voltage on a match line indicating the match condition in response to one of the data cell voltage and the reference cell voltage.

19. A method of comparing search data to stored data in a non-volatile (NV)-content addressable memory (CAM) cell, comprising:
- receiving search data on a search line in response to a search operation;
- receiving complementary search data, complementary to the search data, on a complementary search line in response to the search operation;
- in response to the search data being in an activation state on the search line:
  - generating a first differential resistance level between a first magnetic tunnel junction (MTJ) circuit and a second MTJ circuit indicating a match condition of the search data; and
  - generating a differential cell voltage comprising a data cell voltage on a data node and a reference cell voltage on a reference node, in response to generating the first differential resistance level;
- in response to the complementary search data being in the activation state on the complementary search line:
  - generating a second differential resistance level between the first MTJ circuit and the second MTJ circuit indicating the match condition of the search data; and
  - generating the differential cell voltage comprising the data cell voltage on the data node and the reference cell voltage on the reference node, in response to generating the second differential resistance level;
- in response to the reference cell voltage on the reference node indicating the match condition with the search data, coupling a supply voltage rail to the data node; and
- in response to the data cell voltage on the data node indicating a mismatch condition with the search data, coupling the supply voltage rail to the reference node.

20. The method of claim 19, further comprising:
- in response to the reference cell voltage on the reference node indicating the mismatch condition with the search data, decoupling the supply voltage rail from the data node; and
- in response to the data cell voltage on the data node indicating the match condition with the search data, decoupling the supply voltage rail from the reference node.

21. The method of claim 19, wherein:
generating the first differential resistance level between the first MTJ circuit and the second MTJ circuit indicating the match condition of the search data, further comprises:
- coupling a first MTJ device in the first MTJ circuit between the reference node and a first bit line in response to the search data being in the activation state on the search line; and
- coupling a fourth MTJ device in the second MTJ circuit between the data node and a second bit line in response to the search data being in the activation state on the search line; and generating the second differential resistance level between the first MTJ circuit and the second MTJ circuit indicating the match condition of the search data, further comprises:
- coupling a second MTJ device in the first MTJ circuit between the reference node and the first bit line in response to the complementary search data being in the activation state on the complementary search line; and
- coupling a third MTJ device in the second MTJ circuit between the data node and the second bit line in response to the complementary search data being in the activation state on the complementary search line.

22. The method claim 21, further comprising:
- in response to the search data being in a deactivation state on the search line:
  - decoupling the first MTJ device between the reference node and the first bit line; and
  - decoupling the fourth MTJ device between the data node and the second bit line; and
- in response to the complementary search data being in the deactivation state on the complementary search line:
  - decoupling the second MTJ device between the reference node and the first bit line; and decoupling the third MTJ device between the data node and the second bit line.

23. The method of claim 21, wherein:

in response to the search data being in the activation state on the search line, generating the first differential resistance level between the first MTJ circuit and the second MTJ circuit comprises generating a first resistance in the first MTJ device and generating a fourth resistance different from the first resistance in the fourth MTJ device; and in response to the complementary search data being in the activation state on the complementary search line, generating the second differential resistance level between the first MTJ circuit and the second MTJ circuit comprises generating a second resistance in the second MTJ device and generating a third resistance different from the second resistance in the third MTJ device.

24. The method of claim 21, further comprising:

in response to write data being asserted on the first bit line and complementary write data being asserted on the second bit line:
  storing the write data from the first bit line into the first MTJ device; and
  storing the write data from the first bit line into the fourth MTJ device; and in response to write data being asserted on the second bit line and complementary write data being asserted on the first bit line:
  storing the write data from the second bit line into the second MTJ device; and
  storing the write data from the second bit line into the third MTJ device.

25. The method of claim 19, further comprising coupling the reference node to the supply voltage rail to pre-charge the reference node and the data node to a supply voltage on the supply voltage rail, in response to a pre-charge signal indicating a pre-charge mode.

26. The method of claim 25, further comprising decoupling the first MTJ circuit and the second MTJ circuit from the data node and the reference node, in response to the search data being in a deactivation state on the search line and the complementary search data being in the deactivation state on the complementary search line.

27. The method of claim 19, further comprising coupling the reference node to the data node in response to a pre-charge signal indicating a pre-charge mode.

28. A non-volatile (NV)-content addressable memory (CAM), comprising:

a plurality of NV-CAM cell arrays each comprising a plurality of NV-CAM cells;

a plurality of match lines each coupled to a respective NV-CAM cell array among the plurality of NV-CAM cell arrays;

at least one pre-charge circuit configured to couple at least one supply voltage rail to the plurality of match lines in response to a pre-charge signal indicating a pre-charge mode in a search operation, to charge the plurality of match lines to a supply voltage coupled to the supply voltage rail; and each NV-CAM cell among the plurality of NV-CAM cells comprising:

a differential MTJ cell circuit, comprising:
  a first MTJ circuit configured to receive search data on a search line and complementary search data, complementary to the search data, on a complementary search line in response to an evaluation phase of the search operation;
  a second MTJ circuit configured to receive the search data on the search line and the complementary search data on the complementary search line in response to the evaluation phase of the search operation;
  the differential MTJ cell circuit configured to generate a differential cell voltage comprising a data cell voltage on a data node and a reference cell voltage on a reference node, in response to:
    a first differential resistance level between the first MTJ circuit and the second MTJ circuit indicating a match condition of the search data, in response to the search data being in an activation state on the search line; and
    a second differential resistance level between the first MTJ circuit and the second MTJ circuit indicating the match condition of the search data, in response to the complementary search data being in the activation state on the complementary search line; and a cross-coupled metal oxide semiconductor (MOS) amplifier circuit, comprising:
  a first transistor configured to be activated in response to the data cell voltage on the data node indicating a mismatch condition with the search data, to couple the at least one supply voltage rail to the reference node; and
  a second transistor configured to be activated in response to the reference cell voltage on the reference node indicating the match condition with the search data, to couple the at least one supply voltage rail to the data node.

29. The NV-CAM of claim 28, wherein the plurality of NV-CAM cells is comprised of a plurality of binary NV-CAM cells.

30. The NV-CAM of claim 28, wherein the plurality of NV-CAM cells is comprised of a plurality of ternary NV-CAM cells.

* * * * *